(12) United States Patent
Das et al.

(10) Patent No.: US 11,509,310 B2
(45) Date of Patent: Nov. 22, 2022

(54) CHARGE LOCKING CIRCUITS AND CONTROL SYSTEM FOR QUBITS

(71) Applicant: Microsoft Technology Licensing, LLC, Redmond, WA (US)

(72) Inventors: Kushal Das, Marsden Park (AU); Alireza Moini, Beecroft (AU); David J. Reilly, Sydney (AU)

(73) Assignee: Microsoft Technology Licensing, LLC, Redmond, WA (US)

( * ) Notice: Subject to any disclaimer, the term of this patent is extended or adjusted under 35 U.S.C. 154(b) by 433 days.

(21) Appl. No.: 16/704,650

(22) Filed: Dec. 5, 2019

(65) Prior Publication Data

US 2020/0395943 A1    Dec. 17, 2020

Related U.S. Application Data

(60) Provisional application No. 62/862,606, filed on Jun. 17, 2019, provisional application No. 62/929,545, filed on Nov. 1, 2019.

(51) Int. Cl.
*H03K 19/195* (2006.01)
*H02M 1/08* (2006.01)
(Continued)

(52) U.S. Cl.
CPC ....... *H03K 19/1958* (2013.01); *G06F 1/0321* (2013.01); *G06F 9/30098* (2013.01);
(Continued)

(58) Field of Classification Search
CPC .............. H03K 19/1958; H03K 19/195; G06F 1/0321; G06F 9/30098; G06F 9/4498;
(Continued)

(56) References Cited

U.S. PATENT DOCUMENTS

2009/0015317 A1    1/2009  DiVincenzo et al.
2020/0394548 A1   12/2020  Das et al.

OTHER PUBLICATIONS

Puddy et al (Applied Phys. Letters, 107, 143501, 2015) Multiplexed charge-locking device for large arrays of quantum devices (Year: 2015).*

(Continued)

*Primary Examiner* — Arnold M Kinkead
(74) *Attorney, Agent, or Firm* — Ranjeev Singh; Singh Law, PLLC

(57) ABSTRACT

Systems and methods related to charge locking circuits and a control system for qubits are provided. A system for controlling qubit gates includes a first packaged device comprising a quantum device including a plurality of qubit gates, where the quantum device is configured to operate at a cryogenic temperature. The system further includes a second packaged device comprising a control circuit configured to operate at the cryogenic temperature, where the first packaged device is coupled to the second packaged device, and where the control circuit comprises a plurality of charge locking circuits, where each of the plurality of charge locking circuits is coupled to at least one qubit gate of the plurality of qubit gates via an interconnect such that each of the plurality of charge locking circuits is configured to provide a voltage signal to at least one qubit gate.

20 Claims, 24 Drawing Sheets

(51) Int. Cl.
  *G06N 10/00* (2022.01)
  *H01L 27/24* (2006.01)
  *G06F 9/448* (2018.01)
  *G06F 1/03* (2006.01)
  *G06F 9/30* (2018.01)
  *G11C 11/44* (2006.01)
  *H02M 3/07* (2006.01)

(52) U.S. Cl.
  CPC .......... *G06F 9/4498* (2018.02); *G06N 10/00* (2019.01); *G11C 11/44* (2013.01); *H01L 27/2436* (2013.01); *H02M 1/08* (2013.01); *H02M 3/07* (2013.01); *H03K 19/195* (2013.01)

(58) Field of Classification Search
  CPC ..... G06N 10/00; G11C 11/44; H01L 27/2436; H02M 1/08; H02M 3/07
  USPC ........... 706/15, 52; 257/9, 14, 146, E29.168, 257/277; 977/933, 940, 774; 505/170; 326/92, 88
  See application file for complete search history.

(56) References Cited

OTHER PUBLICATIONS

Annunziata, et al., "Tunable Superconducting Nanoinductors", In Journal of Nanotechnology, vol. 21, Issue 44, Oct. 5, 2010, 11 Pages.

Colless, et al., "Dispersive Readout of a Few-Electron Double Quantum Dot with Fast rf Gate Sensors", In Journal of Physical Review Letters, vol. 110, No. 4, Jan. 25, 2013, 5 Pages.

Franke, et al., "Rent's Rule and Extensibility in Quantum Computing", In Journal of Microprocessors and Microsystems, vol. 67, Jun. 1, 2019, 7 Pages.

Lamb, et al., "An FPGA-Based Instrumentation Platform for use at Deep Cryogenic Temperatures", In Journal of Review of Scientific Instruments, vol. 87, Issue 1, Jan. 4, 2016, 8 Pages.

Mahoney, Alice Charlotte., "Integrated Readout at the Quantum-Classical Interface of Semiconductor Qubits", In Thesis submitted for the degree of Doctor of Philosophy, University of Sydney, 2017, 236 Pages.

Ortlepp, et al., "Design Guidelines for Suzuki Stacks as Reliable High-Speed Josephson Voltage Drivers", In Journal of Superconductor Science and Technology, vol. 26, Issue 3, Jan. 21, 2013.

Wang, et al., "18-Qubit Entanglement with Six Photon's Three Degrees of Freedom", In Journal of Physical Review Letters, vol. 120, Issue 26, Jun. 28, 2018, 14 Pages.

West, et al., "Gate-based Single-Shot Readout of Spins in Silicon", In Journal of Nature Nanotechnology, vol. 14, Issue 5, Mar. 11, 2019, 10 Pages.

Ekanayake, et al., "Quantum Bit Controller and Observer Circuits in SOS-CMOS Technology for Gigahertz Low-Temperature Operation", In Proceedings of the 7th IEEE Conference on Nanotechnology, Aug. 2, 2007, pp. 1283-1287.

"International Search Report and Written Opinion Issued in PCT Application No. PCT/US2020/030062", dated Mar. 1, 2021, 12 Pages.

"International Search Report and Written Opinion Issued in PCT Application No. PCT/US2020/030071", dated Mar. 1, 2021, 14 Pages.

Ploeg, et al., "Controllable Coupling of Superconducting Flux Qubits", In Journal of Physical Review Letters, vol. 98, Issue, 5, Feb. 2, 2007, 4 Pages.

* cited by examiner

CHARGE LOCKING CIRCUITS AND CONTROL SYSTEM FOR QUBITS

CROSS-REFERENCE TO RELATED APPLICATIONS

This application claims the benefit of U.S. Provisional Application No. 62/862,606, filed Jun. 17, 2019, entitled "CRYOGENIC-CMOS CONTROL CIRCUITS AND CONTROL ARCHITECTURE FOR A QUANTUM COMPUTING DEVICE," and U.S. Provisional Application No. 62/929,545, filed Nov. 1, 2019, entitled "CRYOGENIC-CMOS INTERFACE FOR CONTROLLING QUBITS," the entire contents of each of which are hereby incorporated herein by reference.

BACKGROUND

Semiconductor based integrated circuits used in electronic devices, such as digital processors, include digital circuits based on complementary metal-oxide semiconductor (CMOS) technology. An additional approach to the use of processors and related components, based on CMOS technology, is the use of superconducting logic based devices. Superconducting logic based devices can also be used to process quantum information, such as qubits.

SUMMARY

In one aspect, the present disclosure relates to a system for controlling qubit gates. The system may include a first packaged device comprising a quantum device including a plurality of qubit gates, where the quantum device is configured to operate at a cryogenic temperature. The system may further include a second packaged device comprising a control circuit configured to operate at the cryogenic temperature, where the first packaged device is coupled to the second packaged device, and where the control circuit comprises a plurality of charge locking circuits, where each of the plurality of charge locking circuits is coupled to at least one qubit gate of the plurality of qubit gates via an interconnect such that each of the plurality of charge locking circuits is configured to provide a voltage signal to at least one qubit gate.

In another aspect, the present disclosure relates to a method a system for controlling qubit gates comprising a quantum device including a plurality of qubit gates, where the quantum device is configured to operate at a cryogenic temperature and a control circuit configured to operate at the cryogenic temperature, and where the control circuit comprises a plurality of charge locking circuits, where each of the plurality of charge locking circuits is coupled to at least one qubit gate of the plurality of qubit gates via an interconnect such that each of the plurality of charge locking circuits is configured to provide a voltage signal to the at least one qubit gate, and where each of the plurality of charge locking circuits comprises a first terminal for receiving an input voltage signal and a second terminal for selectively receiving a first voltage amount or a second voltage amount, and where the first voltage amount is greater than the second voltage amount. The method may include operating a first subset of the plurality of charge locking circuits in a capacitive mode such that the voltage signal output to at least one qubit gate comprises a pulse signal having a first controlled magnitude, where the first controlled magnitude depends on an amount of the input voltage signal and each of the first voltage amount and the second voltage amount. The method may further include operating a second subset of the plurality of charge locking circuits in a direct mode such that the voltage signal output to at least one qubit gate comprises a signal having a second controlled magnitude where the second controlled magnitude depends on the input voltage signal and only one of the first voltage amount or the second voltage amount.

In yet another aspect, the present disclosure relates to a system for controlling qubit gates. The system may include a quantum device including a plurality of qubit gates, where the quantum device is configured to operate at a cryogenic temperature. The system may further include a control circuit configured to operate at the cryogenic temperature, where the control circuit comprises a plurality of charge locking circuits, where each of the plurality of charge locking circuits is coupled to at least one qubit gate of the plurality of qubit gates via an interconnect such that each of the plurality of charge locking circuits is configured to provide a voltage signal to the at least one qubit gate, and where each of the plurality of charge locking circuits comprises an input terminal for receiving an input voltage signal and an output terminal for selectively providing the voltage signal to the at least one qubit gate, and where the control circuit further comprises control logic configured to provide at least one control signal associated with each of the plurality of charge locking circuits.

In still another aspect, the present disclosure relates to a system for controlling qubit gates. The system may include a first packaged device comprising a quantum device including a plurality of qubit gates, where the quantum device is configured to operate at a cryogenic temperature. The system may further include a second packaged device comprising a control system configured to operate at the cryogenic temperature, where the first packaged device is coupled to the second packaged device. The control system may include a plurality of charge locking circuits, where each of the plurality of charge locking circuits is coupled to at least one qubit gate of the plurality of qubit gates via an interconnect such that each of the plurality of charge locking circuits is configured to provide a voltage signal to at least one qubit gate. The control system may further include a control circuit comprising a finite state machine configured to provide at least one control signal to selectively enable at least one of the plurality of charge locking circuits and to selectively enable a provision of at least one voltage signal to a selected one of the plurality of charge locking circuits.

In another aspect, the present disclosure relates to a system for controlling qubit gates. The system may include a first packaged device comprising a quantum device including a plurality of qubit gates, where the quantum device is configured to operate at a cryogenic temperature. The system may further include a second packaged device comprising a control system configured to operate at the cryogenic temperature, where the first packaged device is coupled to the second packaged device. The control system may include a plurality of charge locking circuits, where each of the plurality of charge locking circuits is coupled to at least one qubit gate of the plurality of qubit gates via an interconnect such that each of the plurality of charge locking circuits is configured to provide a voltage signal to at least one qubit gate. The control system may further include a control circuit comprising control logic configured to provide at least one control signal to selectively enable at least one of the plurality of charge locking circuits.

In yet another aspect, the present disclosure relates to a system for controlling qubit gates. The system may include a first packaged device comprising a quantum device including a plurality of qubit gates, where the quantum device is configured to operate at a cryogenic temperature. The system may further include a second packaged device comprising a control system configured to operate at the cryogenic temperature, where the first packaged device is coupled to the second packaged device. The control system may include a plurality of charge locking circuits, where each of the plurality of charge locking circuits is coupled to at least one qubit gate of the plurality of qubit gates via an interconnect such that each of the plurality of charge locking circuits is configured to provide a voltage signal to at least one qubit gate. The control system may further include a digital to analog converter for generating at least one voltage signal. The control system may further include a control circuit comprising a finite state machine configured to provide at least one control signal to selectively enable at least one of the plurality of charge locking circuits and to selectively enable a provision of the at least one voltage signal to a selected one of the plurality of charge locking circuits.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
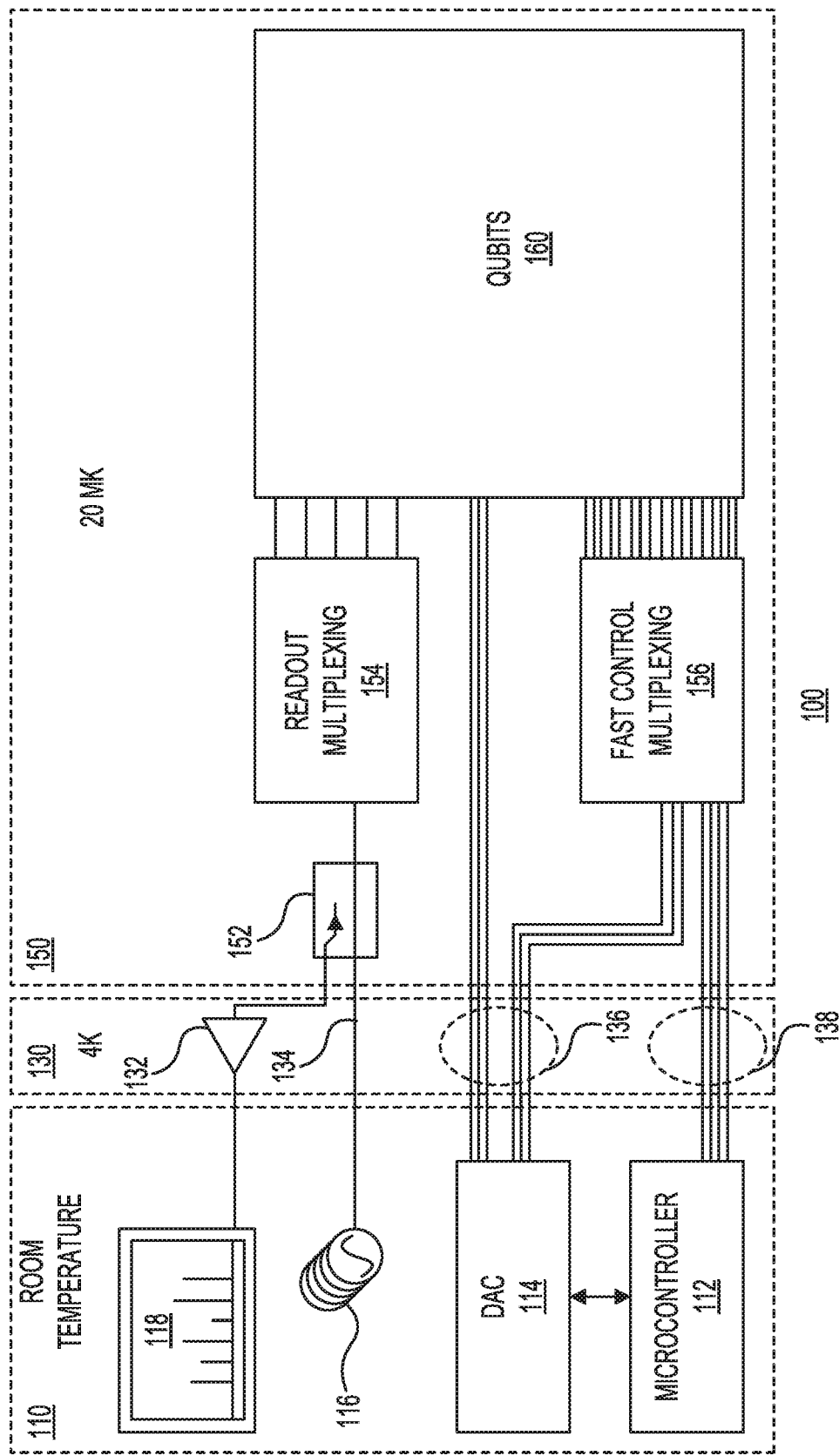
FIG. 1 shows a system 100 for controlling qubits in accordance with one example.

Examples described in this disclosure relate to a system for controlling qubit gates. Controlling a quantum device requires generating a very large number of static and dynamic voltage signals, ideally at cryogenic temperatures in close integration with the quantum device. As used in this disclosure, the term "cryogenic temperatures") means any temperature equal to or less than 300 Kelvin. This is a major challenge given that the cryo-environment strongly constrains power dissipation of any active electronics. In addition, the large number of voltage signals also need to be coupled to the qubit gates in the quantum computing device. This is because potentially many thousands of wires need to be connected to the voltage sources for driving the qubit gates in the quantum computing device. Moreover, conventionally qubits have been controlled with room temperature pulse generators that must generate large signals that are attenuated in the cryostat. The power required to overcome this attenuation, and furthermore the power needed to drive the cable impedance, is an impediment to scaling quantum computers.

Examples described in this disclosure relate to cryogenic control circuits and architecture for a quantum computing device. The control architecture includes an integrated circuit control chip, containing cryogenic control circuits, that is tightly integrated with the qubit plane. As an example, the control chip can be wire-bonded or flip-chip mounted to the qubit plane. In addition, the control chip stores a charge on a capacitor (that includes the interconnect capacitance) to generate a voltage bias. A single digital to analog converter may be used to set the charge on each capacitor, which at cryo-temperatures remains for a long time on account of the extremely low leakage pathways at these temperatures. Refresh of the charge can be made cyclically on timescale commensurate with qubit operation. The challenge associated with heat generated from attenuation is addressed by deploying a "charge-shuffle" circuit—moving charge between capacitors to generate a voltage pulse. The capacitance is reduced as much as possible via the tight integration between the cryogenic-CMOS control chip and the qubit plane. This tight integration, for example via chip-stack packaging approaches, can reduce the capacitance dramatically, thereby impacting the dissipated power.

In one example, the cryogenic-CMOS control chip may be implemented using the fully-depleted semiconductor on insulator (FDSOI) process. In one example, the FDSOI process based devices may include an undoped gate channel, an ultra-thin body, an ultra-thin buried oxide (BOX) below the source, drain, and the gate, and total dielectric isolation from the adjacent devices. The capacitors used for charge storage are implemented using on-chip devices. The back-gate or body bias of each transistor device can be used to configure the threshold voltage dynamically to account for effects associated with cooling. The control chip includes circuit blocks that are partitioned into domains that are given common back-gate bias. Example domains with separate bias include circuit blocks for n-type devices, circuit blocks for p-type devices, circuit blocks for analog devices, and circuit blocks for digital devices. In some examples, different back gate bias is provided for transistors with different aspect ratios.

The qubit plane may include topological computing gates that may operate at approximately 20 milli-Kelvin (~20 mK). The quantum computing devices may process quantum information, e.g., qubits. A qubit may be implemented using various physical systems, including photons, electrons, Josephson junctions, quantum dots, or heterostructures. The quantum state(s) may be encoded as a direction of spin, another aspect of spin, charge, energy, or excitation stages as part of a qubit, or a topological phase of superconducting matter. The example qubits may operate based on either low-frequency DC signals (e.g., bias currents) or high-frequency radio frequency signals (e.g., 10 GHz signals) or based on a combination of both. In certain examples, microwave signals may be used to control the superconducting devices, including, for example the state of the quantum bits (qubits). Certain implementations of the gates for quantum bits (qubits) may require high-frequency microwave signals.

FIG. 1 shows a system 100 for controlling qubits in accordance with one example. In this example, system 100 may include multiple stages, each of which may be configured to operate at a different temperature. Thus, system 100 may include stages 110, 130, and 150. Stage 110 may include components configured to operate at the room temperature (e.g. the ambient temperature) or between 4 Kelvin and the room temperature. Stage 130 may include components configured to operate at or below 300 Kelvin and up to 4 Kelvin. Stage 150 may include components configured to operate at or around 20 milli-Kelvin (mK). Stage 110 may include a microcontroller 112 (or a microprocessor), a digital-to-analog converter (DAC) 114, signal generators 116, and measurement devices 118. Microcontroller 112 may generate control signals configured to control qubits and other aspects of system 100. DAC 114 may receive digital control signals from microcontroller 112 (or from other components) and convert those into an analog form. The analog signals may then be transmitted to the other stages, as needed. Signal generators 116 may include microwave signal generators and other clock signal generators, as needed. Measurement devices 118 may include instrumentation, such as spectrum analyzers.

With continued reference to FIG. 1, stage 130 may include components configured to interconnect stage 110 with stage 150 in a manner that reduces thermal load and allows efficient connectivity between the components at room temperature and the components at 20 milli-Kelvin (mK). Thus, in this example, stage 130 may include component 132, interconnect 134, interconnect 136, and interconnect 138. In one example, component 132 may be implemented as high-electron-mobility transistor(s) (HEMT(s)) low noise amplifiers. Interconnects 134, 136, and 138 may be implemented as cables comprising conductors, such as niobium and copper. The conductors may be insulated within the interconnects using appropriate dielectric materials, such as polyimide.

Still referring to FIG. 1, stage 150 may include a coupler 152, readout multiplexing 154, fast control multiplexing 156, and qubits 160. Coupler 152 may couple signals from the signal generators (e.g., signal generators 116) to readout multiplexing 154. Coupler 152 may also direct any reflected signals to component 132. Readout multiplexing 154 and fast control multiplexing 156 may be implemented on a single control chip (sometimes referred to as the cryogenic-control CMOS chip). In one example, readout multiplexing 154 may be implemented using superconducting materials, such as niobium on an inert substrate, such as sapphire. Readout multiplexing 154 chip may contain multiple inductive, capacitive, and resistive elements of suitable sizes to form bank(s) of resonators. At cryogenic temperatures, resonator circuits exhibit superconductivity and produce a resonator with high quality factors. This may provide an efficient low loss frequency multiplexing mechanism. In one example, the cryogenic-CMOS control chip (e.g., an ASIC manufactured using a semiconductor technology, such as CMOS) may be mounted on the same substrate as the qubits (e.g., qubits 160) and may be configured to operate at the same cryogenic temperature as the qubits (e.g., 20 mK).

Figure 2:
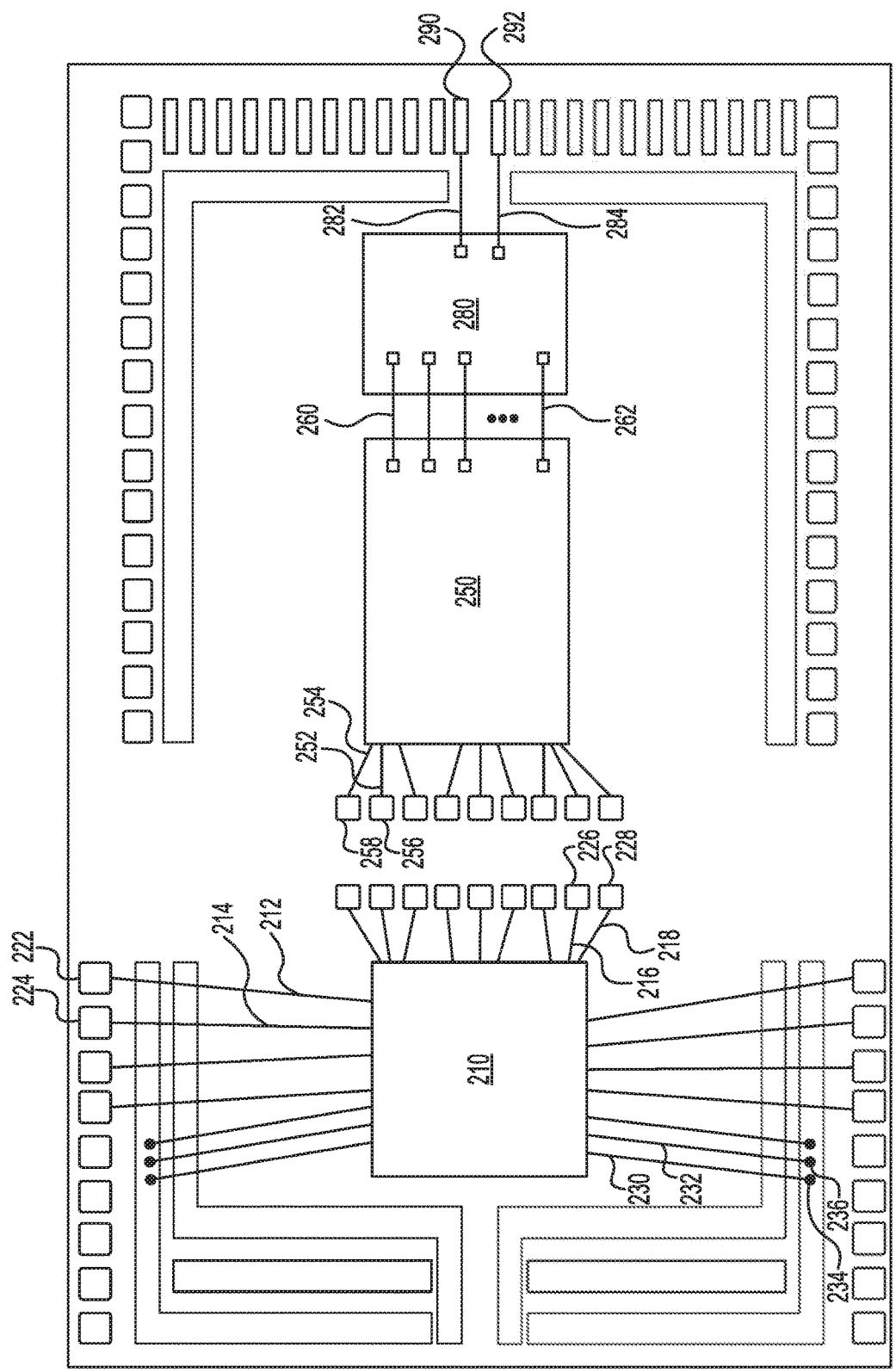
FIG. 2 shows a common substrate including a cryogenic-CMOS control chip, a qubit chip, and a resonator chip in accordance with one example.

FIG. 2 shows a common substrate 200 including a cryogenic-CMOS control chip 210, a qubit chip 250, and a resonator chip 280 in accordance with one example. Cryogenic-CMOS control chip 210 may be coupled to contact pads (e.g., contact pads 222 and 224) via wire bonds (e.g., wire bonds 212 and 214). Cryogenic-CMOS control chip 210 may further be coupled to contact pads (e.g., contact pads 226 and 228) via wire bonds (e.g., wire bonds 216 and 218). Cryogenic-CMOS control chip 210 may further be coupled to other contacts (e.g., contacts 234 and 236) via wire bonds (e.g., wire bonds 230 and 232). Qubit chip 250 may be coupled to contact pads (e.g., contact pads 256 and 258) via wire bonds (e.g., wire bonds 252 and 254). Qubit chip 250 may be coupled to resonator chip 280 via wire bonds (e.g., wire bonds 260 and 262). Resonator chip 280 may be coupled to contacts (e.g., contacts 290 and 292) via wire bonds (e.g., wire bonds 282 and 284). Although not shown in FIG. 2, to mitigate unwanted heating of the quantum devices, the chip-packaging arrangement may also include thermal management by cementing each chip to separate gold-plated copper pillars that are in parallel thermal contact to the mixing-chamber stage of a dilution refrigerator. Although this example shows the tight integration between the control chip and the qubits via wire bonding, other techniques may also be used. As an example, the control chip may be flip-chip bonded to the substrate with the qubits. Alternatively, package-on-package, system-in-package, or other multi-chip assemblies may also be used.

In this example, the cryogenic-CMOS control chip may be implemented in 28 nm-FDSOI technology, an inherently low-power, low-leakage CMOS platform that is suited to cryogenic operation. Transistors in FDSOI may provide the utility of configuring a back-gate bias to offset changes in threshold voltage with temperature. This example platform provides high (1.8V) and low (1V) voltage cells and also allows for individual back-gate control of n-type and p-type transistors or entire circuit blocks, a useful aspect in mixed-signal circuit design, such as the example control system.

Figure 3:
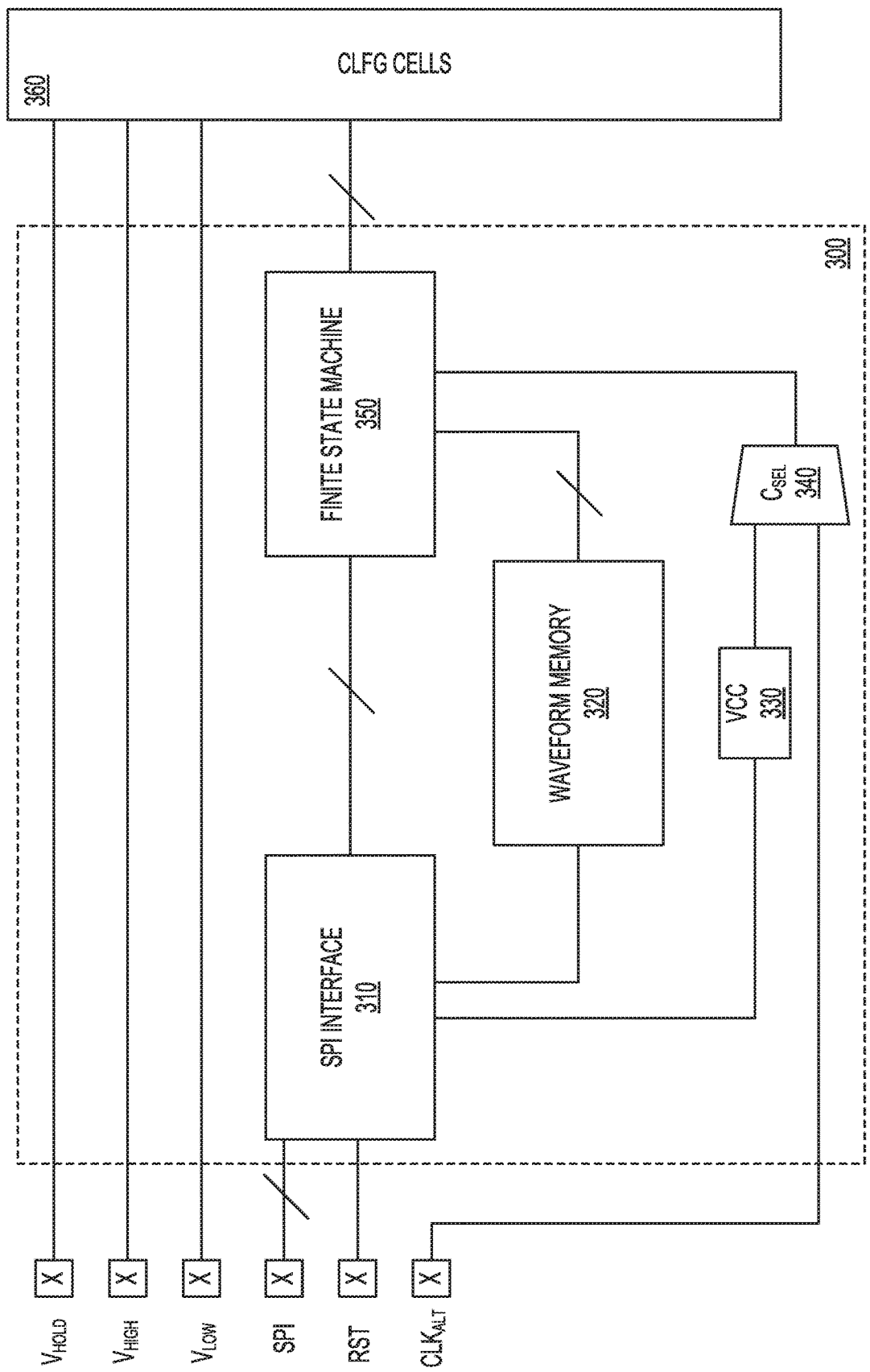
FIG. 3 shows a block diagram of a control system associated with fast control multiplexing in accordance with one example.

FIG. 3 shows a block diagram of a control system 300 associated with fast control multiplexing 156 in accordance with one example. Control system 300 may be used to control the behavior of charge locking and fast gating (CLFG) cells 360 incorporated as part of the control chip. Control system 300 may include a serial peripheral interface (SPI) interface 310, a waveform memory 320, a voltage-controlled oscillator (VCO) 330, a clock select multiplexer ($C_{SEL}$) 340, and finite state machines 350. As shown, three different voltage levels may be coupled to the cells, including $V_{HOLD}$, $V_{HIGH}$, and $V_{LOW}$. $C_{SEL}$ 340 is used to select the clock signal provided to the finite state machines. Additional details regarding the finite state machines and related registers are provided later.

Figure 4:
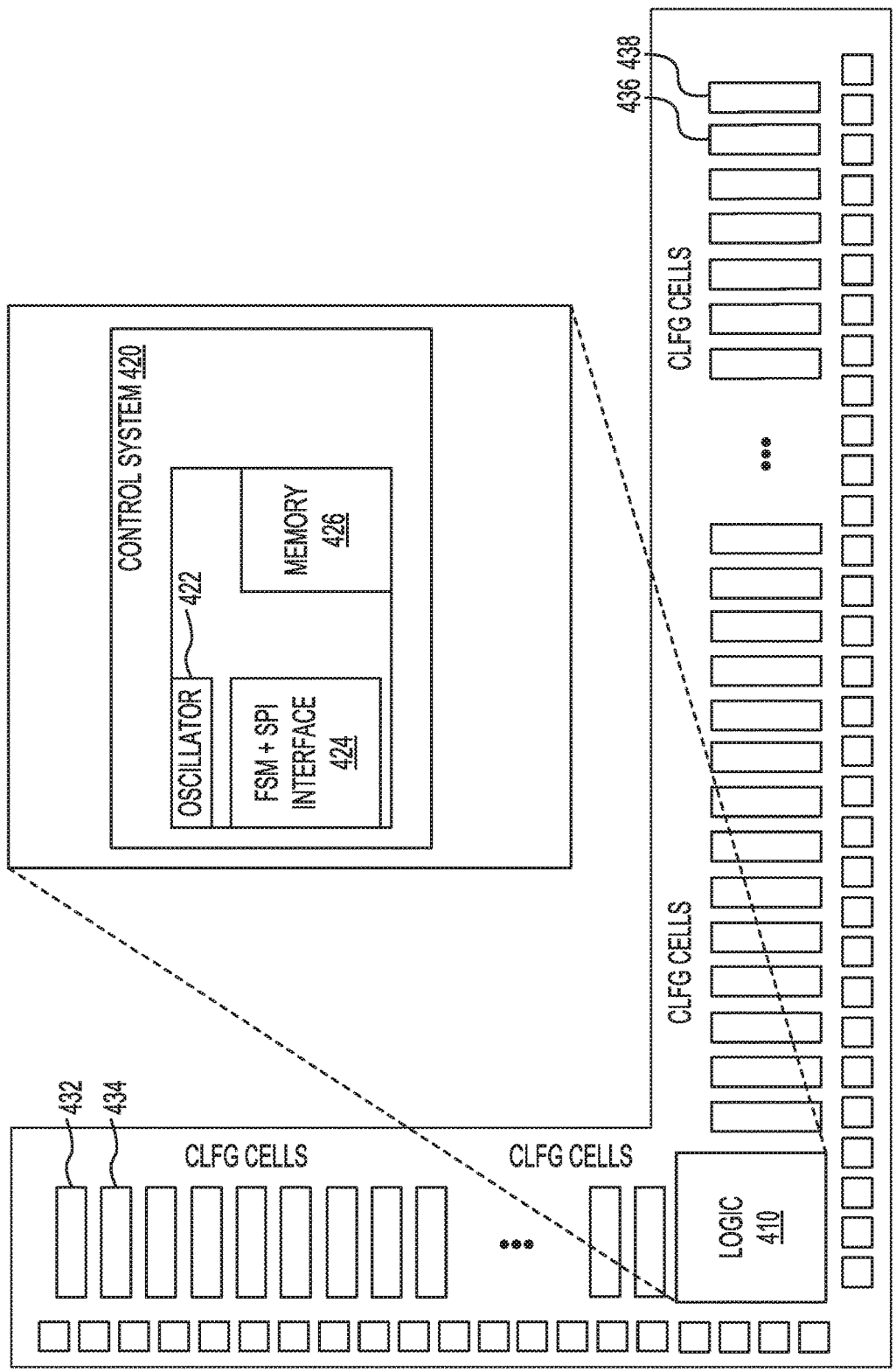
FIG. 4 shows a floorplan of a cryogenic-CMOS control chip including a control system in accordance with one example.

In one example, control system 300 may be implemented as part of a cryogenic-CMOS control chip. FIG. 4 shows a floorplan of a cryogenic-CMOS control chip 400, including a control system 420 (similar to control system 300 of FIG. 1), in accordance with one example. Cryogenic-CMOS control chip 400 may include both digital and analog blocks. In this example, cryogenic-CMOS control chip 400 may include charge-locking and fast-gating (CLFG) cells and components corresponding to control system 420. In this example, cryogenic-CMOS control chip 400 may include logic 410 and CLFG cells. In one example, logic 410 may include a series of coupled digital logic circuits that provide communication, waveform memory, and autonomous operation of the chip via two FSMs. Logic 410 may include a control system 420, which may include an oscillator 422, finite state machine(s) FSM and SPI interface (e.g., FSM+SPI interface) 424, and memory 426. Oscillator 422 may be implemented as a ring-oscillator with configurable length and frequency divider. Additional details regarding the FSM are provided later. Memory 426 may be configured as a 128-bit register allowing arbitrary pulse-patterns to be stored. Tiled along the left and bottom edge of the chip may be a repeating analog circuit block "CLFG" that generates the static and dynamic voltages needed for controlling qubits. CLFG cells may include cells 432, 434, 436, and 438. In the example described here, although the CLFG cells are realized on a single die, they could be formed on a number of dies packaged together or otherwise interconnected. Although FIG. 4 shows a certain floor plan for cryogenic-CMOS control chip 400, the chip may have a different floor plan. In addition, although FIG. 4 shows certain number of components arranged in a certain manner, cryogenic-CMOS control chip 400 may include additional or fewer components arranged differently.

Figure 5:
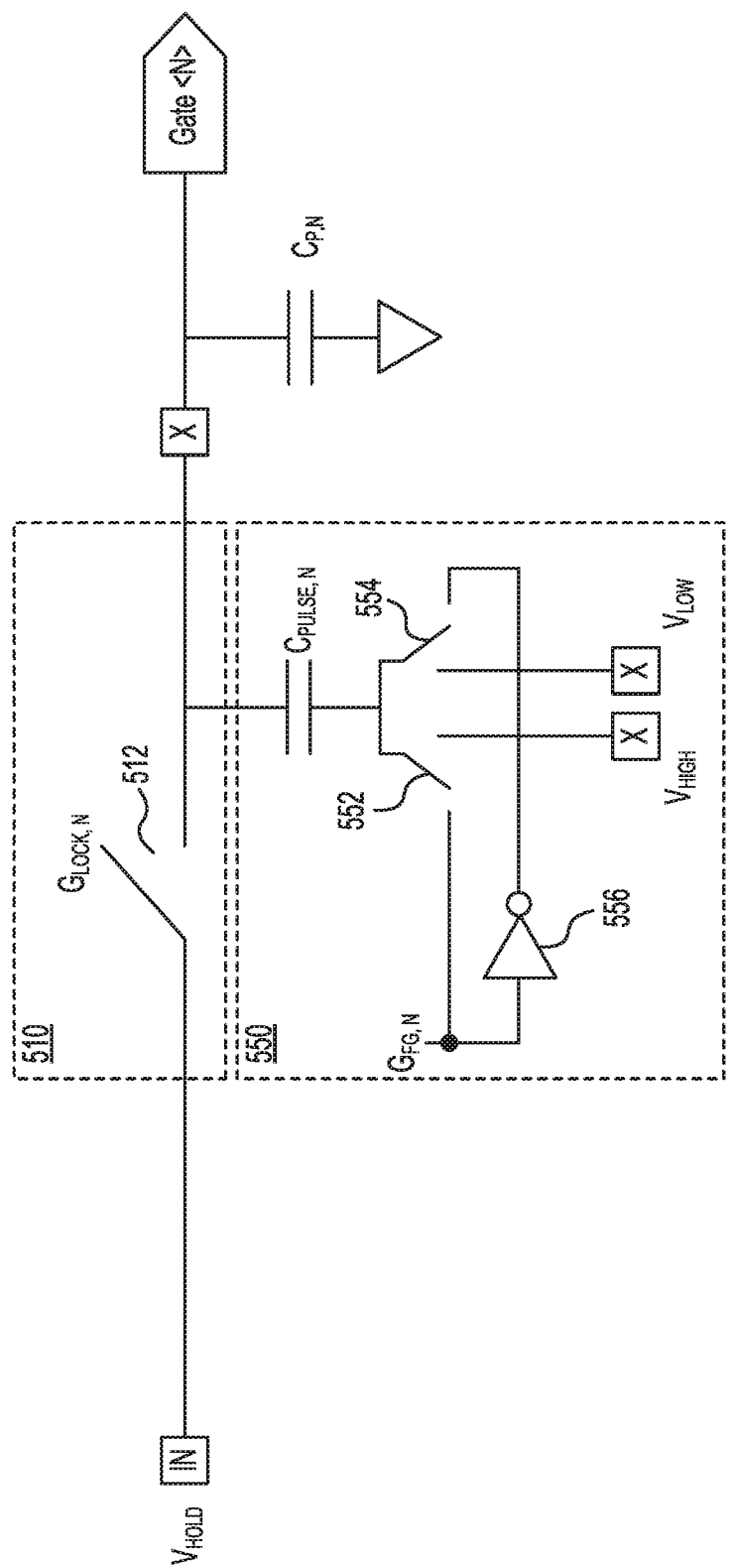
FIG. 5 shows a charge-locking fast-gating (CLFG) cell in accordance with one example.

FIG. 5 shows a CLFG cell 500 in accordance with one example. CLFG cell 500 may be configured to lock charge and provide a voltage output. Each CLFG cell 500 may correspond to any of N number of cells. CLFG cell 500 may include two portions: a portion 510 for coupling a static voltage to the output terminal (labeled as GATE<N>) and a portion 550 for coupling a dynamic voltage (based on one of voltage $V_{HIGH}$ or voltage $V_{LOW}$) to the output terminal. Portion 510 of CLFG cell 500 may include a switch 512, which may be operated in response to a signal $G_{LOCK,N}$. This signal may be provided under the control of an appropriate finite state machine or another type of control logic or instructions. When switch 512 is closed the voltage $V_{HOLD}$ may be coupled to one plate of the capacitor labeled $C_{PULSE,N}$, which represents the on-chip capacitance. Portion 550 of CLFG cell 500 may further include a switch 552 and a switch 554. CLFG cell 500 may further include an inverter 556. CLFG cell 500 may be configured such that only one of these switches (switch 552 and switch 554) is closed at a time. In this example, the signal that is labeled $G_{FP,N}$ may control switch 552 and an inverted version of this signal (e.g., inverted by inverter 556) may control switch 554. This way at a time either voltage $V_{HIGH}$ or voltage $V_{LOW}$ may be coupled via one of the two switches to the second plate of capacitor labeled $C_{PULSE,N}$, which represents the on-chip capacitance.

With continued reference to FIG. 5, $C_P$ may be the sum of parasitic capacitances due to the wiring in the cryogenic-CMOS control chip and the qubit chip(s) and the wires (or other interconnects) used to interconnect the two. A cell may first be selected for configuration by an on-chip finite state machine (FSM), which connects an external voltage source to the input terminal (labeled IN in FIG. 5) of CLFG cell 500, raising its potential to $V_{HOLD}$. In this example, a single channel of a room temperature digital-to-analog converter (DAC) may be used as the source, and the FSM sequentially switches each CLFG cell into contact with this voltage-bias to energize the capacitors that will then lock the charge required to generate a static voltage at the high-impedance output. The circuit incorporates the on-chip capacitance $C_{PULSE}$ and the parasitic capacitance $C_P$, which includes contributions from the bond-pads, bond-wires, and gate-interconnect on the qubit chip. Following charge-up, switch 512 is opened by the FSM (e.g., by de-asserting the $G_{LOCK,N}$ signal) leaving the charge on the capacitors and the qubit gate floating. This locked charge then remains even as CLFG cell 500 is de-selected, establishing a static voltage that can be used for configuring the offset bias of the qubit device. Although FIG. 5 shows a certain number of components arranged in a certain manner, CLFG cell 500 may include additional or fewer components arranged differently.

Figure 6:
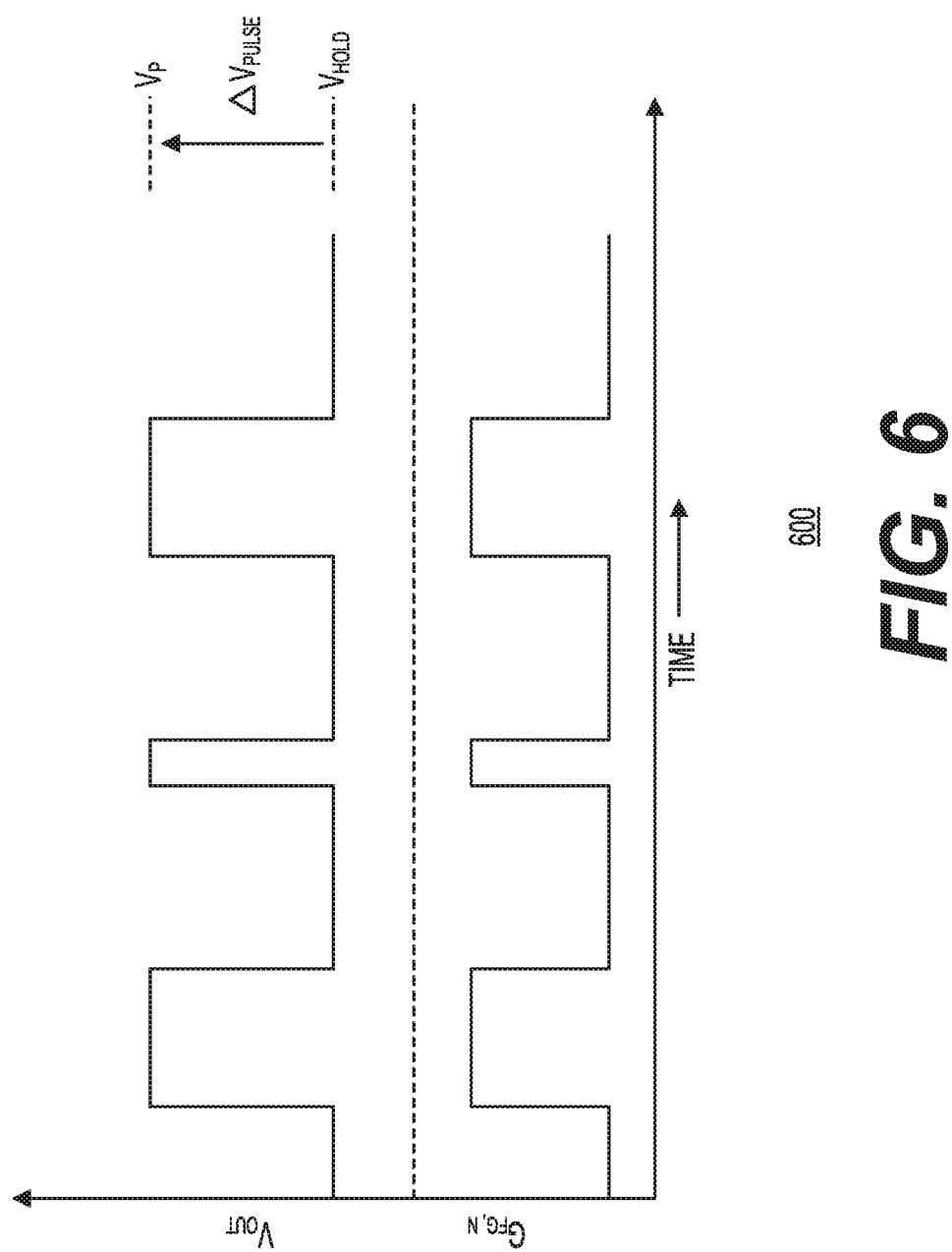
FIG. 6 shows example waveforms 600 associated with the operation of the CLFG cell of FIG. 5.

FIG. 6 shows example waveforms 600 associated with the operation of CLFG cell 500. For dynamic control, a voltage pulse is required to rapidly change the potential of a gate and energy state of the qubit. Generating such a pulse remotely from the qubit plane requires significant energy since the generator must drive the cable impedance, even if power is not dissipated at the end of the open line. Alternatively, a sizable voltage pulse can be generated with little energy by the redistribution of local charge in a circuit with small capacitance. In this example, this concept is exploited to enable the dynamic operation of CLFG cell 500. Under the control of a second FSM, cells are selected for pulsing and a pre-loaded pulse-pattern, stored in the register memory, is applied to the switch $G_{FG}$.

Switches 552 and 554 are controlled in a manner to toggle the lower plate of capacitor $C_{PULSE}$ between two voltage sources $V_{HIGH}$ and $V_{Low}$. These sources can be external to the chip or derived from local, pre-charged capacitors. With the potential of the lower plate of the $C_{PULSE}$ switched to $V_{LOW}$ or $V_{HIGH}$, charge is induced on the top-plate, changing the output voltage $V_{OUT}$ that is referenced with respect to ground.

In this example, the magnitude of the pulse is given by $\Delta V_{PULSE}=(C_{PULSE}/(C_P+C_{PULSE}))(V_{HIGH}-V_{LOW})$, and the power dissipated $P_{PULSE}$ is given by the total capacitance, pulse frequency f, and voltage of the two levels, $P_{PULSE}=((C_P*C_{PULSE})/(C_P+C_{PULSE}))(V_{HIGH}-V_{LOW})^2 f$. Because $C_P$ and $C_{PULSE}$ are (pF) chip-scale capacitances, they require very little power to charge.

Figure 7A:
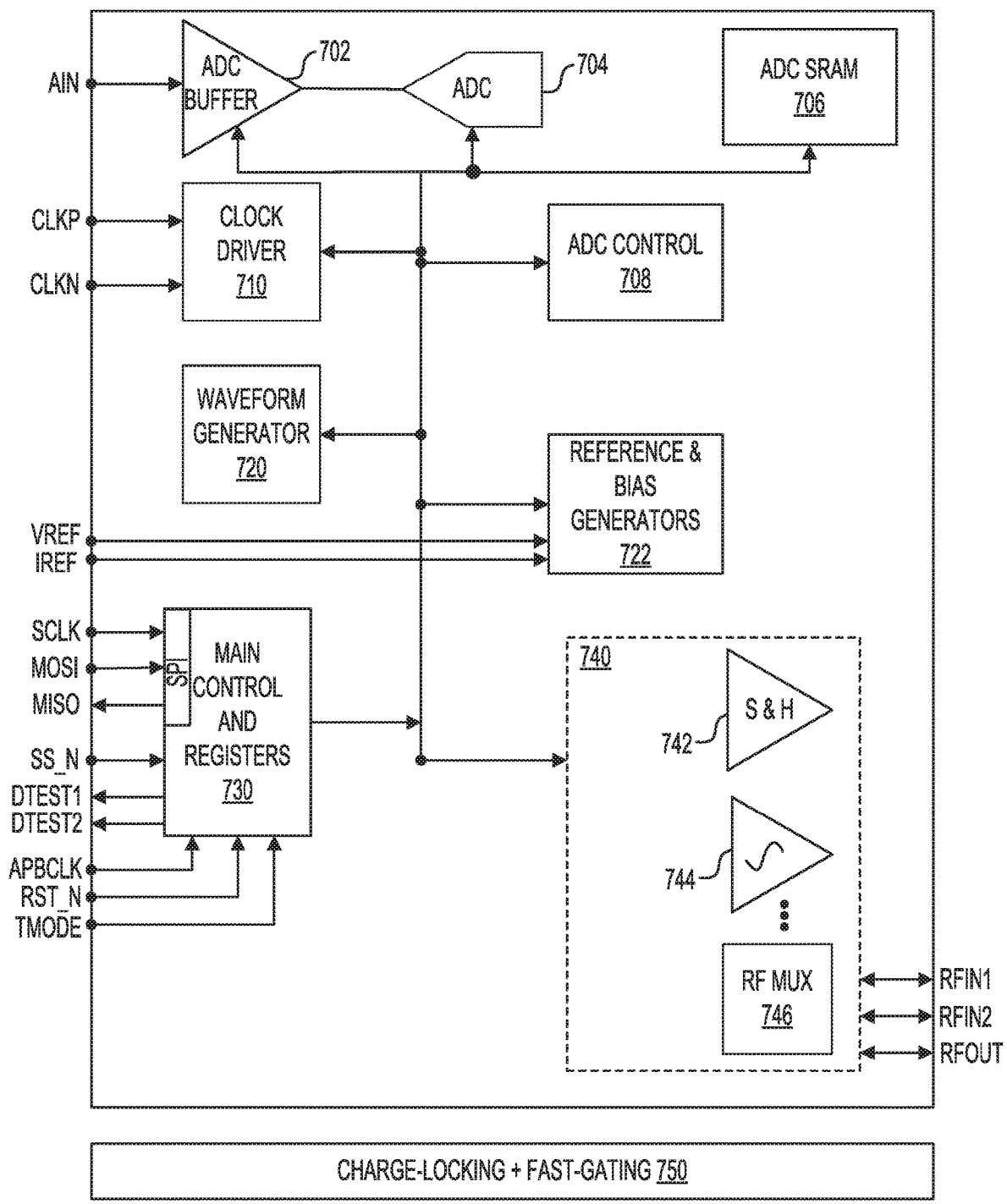
FIGS. 7A and 7B show various blocks associated with a cryogenic-CMOS control chip 700 in accordance with one example.
Figure 7B:
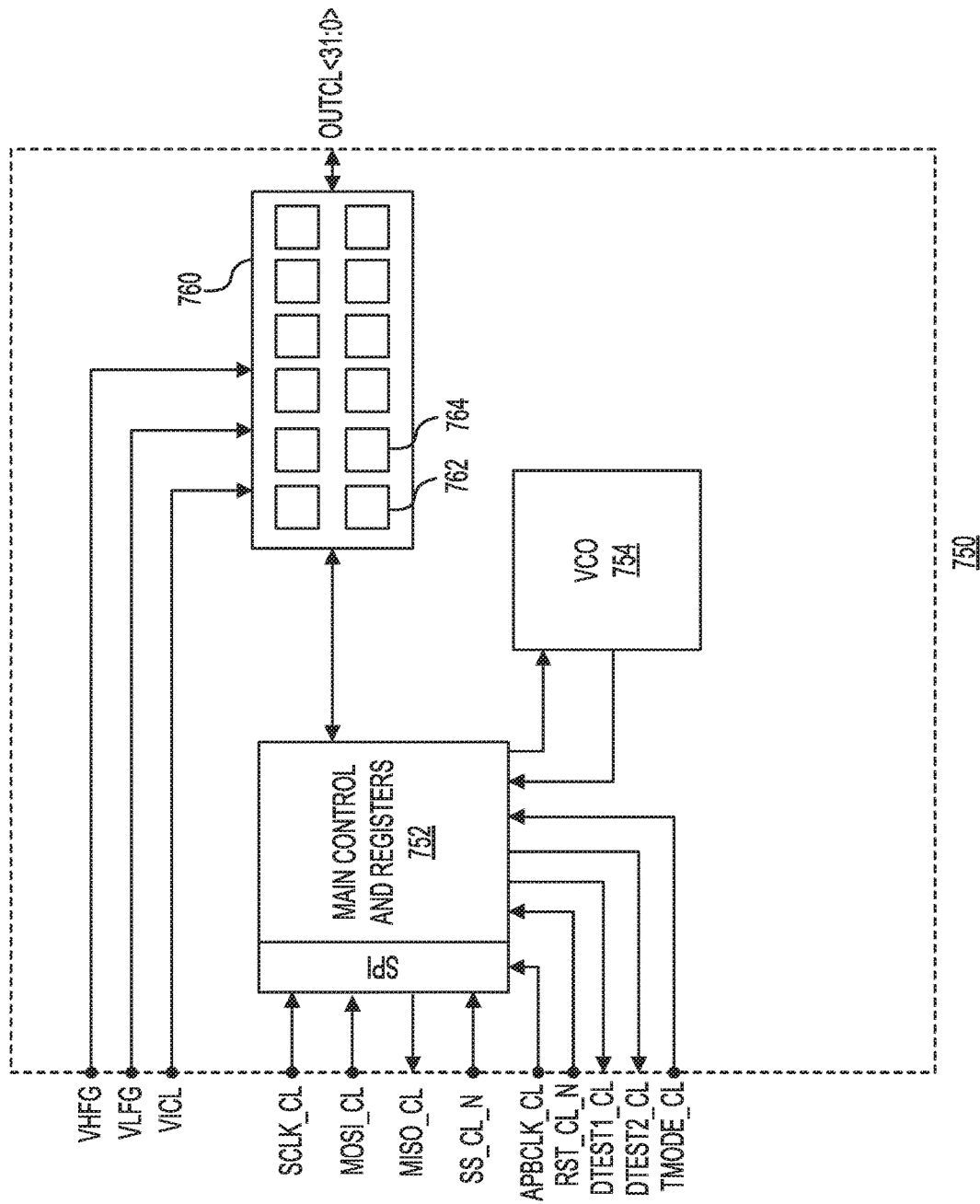

FIGS. 7A and 7B show various blocks associated with a cryogenic-CMOS control chip 700 in accordance with one example. As explained earlier, cryogenic-CMOS control chip 700 may include both analog and digital components.

In this example, cryogenic-CMOS control chip may include an analog-digital converter (ADC) buffer 702, an ADC 704, an ADC SRAM 706, and an ADC control 708. Cryogenic-CMOS control chip 700 may further include a clock driver 710, a waveform generator 720, and reference and bias generators 722. These components may be coupled via various buses. Each bus may include at least one signal line. As shown in FIGS. 7A and 7B, cryogenic-CMOS control chip 700 may receive various external signals, including clock signals, various voltages, and control signals. As shown, some of the clocks are externally generated and received via pins associated with the control chip.

With continued reference to FIG. 7A, cryogenic-CMOS control chip 700 may further include main control and registers 730 and various miscellaneous blocks 740. Main control and registers 730 may include a serial-peripheral interface (SPI), which may allow communication with external processors. Miscellaneous blocks 740 may include a sample-and-hold (S&H) block 742, a comparator 744, and a radio frequency (RF) multiplexer (MUX) 746. RF MUX 746 may allow selection between two radio frequency signals (RFIN1 and RFIN2). In this example, there is an advanced peripheral block clock (APBCLK) input for main control and registers 730 and a separate APBCLK input pin for the charge-locking and fast-gating block 750. As shown in FIG. 7B, for charge-locking and fast-gating 750, there is also the ability to switch to the local oscillator (e.g., VCO 754). The local oscillator can also be divided down through a configuration register. The SPI clock (SCLK) comes from the SPI master. In this example, there is a clock ratio requirement between APBCLK and SCLK from the SPI master. In one example, APBCLK must be >=4*SCLK. To ensure proper clocking, a clock domain crossing (CDC) logic is arranged between the SCLK and the APBCLK and another CDC logic is arranged between the APBCLK and the divided oscillator clock.

FIG. 7B shows a diagram of some of the aspects of charge-locking and fast-gating 750. Charge-locking and fast-gating 750 may include main control and registers 752, a voltage controlled oscillator (VCO) 754, and CLFG cell array 760. Control and registers 752 may include an SPI interface. Control and registers 752 may include a register read/write block, which in turn may be coupled to a register file. VCO 754 may be configured to provide another clock signal for use with some of the aspects of charge-locking and fast-gating 750. CLFG cell array 760 may include CLFG cells 762 and 764, each of which may be similar to CLFG cell 500 of FIG. 5.

Figure 8:
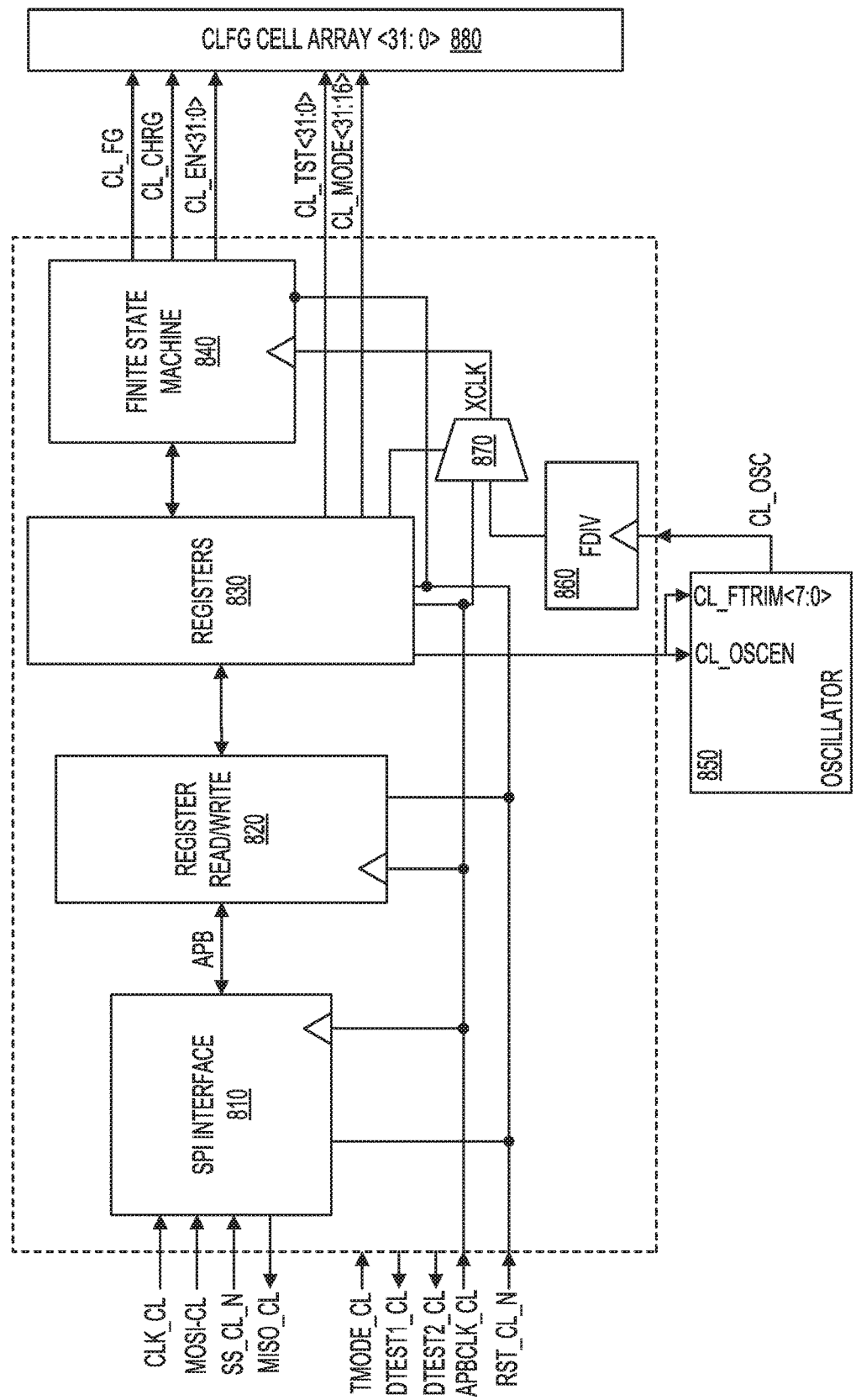
FIG. 8 shows a block diagram of charge-locking and fast-gating in accordance with one example.

FIG. 8 shows a block diagram of charge-locking and fast-gating (CLFG) 800 in accordance with one example. CLFG 800 may include SPI interface 810, coupled via a bus (e.g., APB) to a register read/write interface 820, which in turn may be coupled to registers 830 (e.g., registers may be included as part of a register file). CLFG 800 may further include finite state machine 840, which may be configured to receive input from the registers and provide output signals to CLFG cell array 880, which in turn may provide the voltage to the qubits. CLFG 800 may further include an oscillator 850, a frequency divider (FDIV) 860 and a multiplexer 870. Multiplexer 870 may receive the APB clock as one input and the frequency divider output as the other input. This way, in this example, the finite state machines can run off either APBCLK or a clock signal from the local oscillator. A clock control module may be used to divide down the local oscillator clock from integer values of 1 to 255, and multiplexer 870 may be used to allow switching between the APBCLK and the divided oscillator clock. There are no duty cycle requirements on the divided clock. The clock output of the clock control module is referred to as XCLK and it is used to clock the finite state machines.

Table 1 below lists some of the signals and their descriptions for the cryogenic-CMOS control chip.

TABLE 1

| Signal | Description |
| --- | --- |
| OUTCL<31:0> | Output nodes/pins of charge locking cells |
| VICL | Voltage that user intends to "lock"/store on the capacitor on OUTCL node |
| CL_CHRG | Control signal for charge locking. Whenever this control signal is high, the OUTCL terminal is charged to the voltage at the VICL terminal |
| CL_FG | Control signal for charge shuffling. Whenever this control signal is high, the voltage at the OUTCL terminal pulses between VICL + delta and VICL |
| VLFG, VHFG | Controls the pulse amplitude and polarity; delta = VHFG − VLFG. User can provide different values for VLFG, VHFG voltage to control delta. |
| CL_EN | Enable signal for the charge locking cell |

Table 2 lists some of the registers associated with the cryogenic-CMOS control chip. Since the description of most of the registers is self-explanatory, only some of the registers, and their functionality, are described to explain the operation of the cryogenic-CMOS control chip.

TABLE 2

| Register | Address | Bit Fields | Name | Description |
| --- | --- | --- | --- | --- |
| REG_ERR_LOG | 0x0 | 7:0 | ERR_CNT | Error count reported |
|  |  | 15:8 | ERR_INFO | Error information reported |
|  |  | 17:16 | ERR_TYPE | Error type reported |
| REG_IOCTL | 0x4 | 2:0 | DRIVE | Output pad drive strength. Default = "111" |
| REG_DBGCTL | 0x8 | 2:0 | DTEST1_MUX | Control the mux that sends output to the DTEST1 pin 3'b000: apbclk 3'b001: sclk 3'b010: apb_ctl_new_req 3'b011: oscclk 3'b100: cl_clk_out 3'b101: CL_FG 3'b110: CL_CHRG 3'b111: fsm_idleb1 default: 3'b000 (DTEST1 = apbclk) |

TABLE 2-continued

| Register | Address | Bit Fields | Name | Description |
|---|---|---|---|---|
| | | 5:3 | DTEST2_MUX | Control the mux that sends output to the DTEST2 pin<br>3'b000: apbclk<br>3'b001: sclk<br>3'b010: apb_ctl_new_req<br>3'b011: oscclk<br>3'b100: cl_clk_out<br>3'b101: CL_FG<br>3'b110: CL_CHRG<br>3'b111: fsm_idleb1<br>default: 3'b000<br>(DTEST2 = apbclk) |
| REG_CTL1 | 0xC | 31:9 | Reserved | Default 0. |
| | | 8 | FGSR_EN | FGSR enable. 0 = Counter for the FGSR select is held at 0 and does not increment.<br>1 = Counter for the FGSR select increments each XCLK. The counter rolls over when it reaches 127 and continues counting at 0. |
| | | 7:6 | CHRG_SEL | CL_CHRG select. When bit 7 is 1, use bit 6 as the output for CL_CHRG. When bit 7 is 0, the activated finite state machine controls CL_CHRG as part of the DC charge sequence. |
| | | 5:4 | BEGIN_CHRG | Begin charge sequence. When this field transitions from 00->10, a full DC charge sequence occurs to all 32 cells regardless of the value in REG_CLEN. When this field transitions from 00->01, a selective DC charge sequence occurs on cells where the corresponding REG_CLEN bit is 1. |
| | | 3:2 | FG_SEL | FG select. When bit 2 is 1, use bit 3 as the output for CL_FG.<br>The CL_FG output will be the value of bit 3 even if the activated finite state machine is not idle. When bit 2 is 0, the FGSR logic controls CL_FG, and the CL_FG output will be 0 if the activated finite state machine is not idle. |
| | | 1 | XCLK_DIS | Xclk disable. 1 = Turn off xclk input to the DC charge and FG logic. |
| | | 0 | EN_SEL | CL_EN select. 1 = Set CL_EN output to be the same as REG_CLEN. 0 = Allow the activated finite state machine to control CL_EN. |
| REG_CLEN | 0x10 | 31:0 | CLEN | Enable signal for Charge Locking (CL) cells 31:0. Reset value 0. |
| REG_CLMODE | 0x14 | 15:0 | CLMODE | Mode select for 'dual mode' CL cell, i.e. cell 15:0. Default 0 (i.e. cell 15:0 are in capacitive mode) |
| REG_TST | 0x18 | 31:0 | TST | 'Enable leakage test' signal for CL cell 31:0. Default 0 (leakage test disabled). |

TABLE 2-continued

| Register | Address | Bit Fields | Name | Description |
|---|---|---|---|---|
| REG_DCSR | 0x1C | 15:0 | DCSR | This is the timer value used by the activated finite state machine. The state machine waits number of clock cycles specified in this register when charging each cell. |
| REG_CLK_CTL | 0x20 | 7:0 | FDIV | Divider CL_OSC frequency. Default 0 (divide by 1). Note, FDIV = 1 also means divide by 1. |
| | | 8 | OSC_SEL | When 1, CLFG state machine clock input, XCLK is CL_OSO (divided by FDIV). When 0 the activated finite state machine runs on APBCLK_CL |
| | | 16:9 | OSC_TRIM | Trim bits for CL_OSC frequency. Default = 0 (CL_OSC disabled). Note, values must be in thermometer coded, i.e. 1, 2, 4, 8, 16, 32, 64 and 128. |
| | | 17 | OSC_EN | Enable signal for ring oscillator. Default = 0, and output CL_OSC = 0. Note, OSC_EN = 1 and OSC_TRIM ≠ 0 must be met to run oscillator. |
| REG_FGSR0 | 0x24 | 31:0 | DATA | 31:0 for Fast Gating Shift register (FGSR) |
| REG_FGSR1 | 0x28 | 31:0 | DATA | 63:32 for Fast Gating Shift register (FGSR) |
| REG_FGSR2 | 0x2C | 31:0 | DATA | 95:64 for Fast Gating Shift register (FGSR) |
| REG_FGSR3 | 0x31 | 31:0 | DATA | 127:96 for Fast Gating Shift register (FGSR) |

While Table 2 shows certain registers and their arrangement, additional or fewer registers may be used. In addition, the information presented in the tables may be communicated to the cryogenic-CMOS control chip via other modalities besides the registers. As an example, special instructions may be used to encode the information included in the registers. The architecture enabled by registers described in Table 2 assumes 32 charge-locking fast-gating (CLFG) cells. In this example, each CLFG cell can be DC charged independently and can be fast-pulsed according to the waveform stored in FGSRs registers. In this implementation 128 bits can be stored in four 32 bit registers (e.g. registers FGSR0-3) and any of the charge-locking fast-gating cells can be fast-pulsed according to the bit pattern stored in these registers. The bit pattern can be repeated continuously or played once under the control of the FSM. This implementation caters for two level pulsing, it can however be extended to multilevel pulsing. In this example architecture, the REG_CTL1 register described in Table 2 includes information that is used by the activated finite state machine to initiate and complete charging of the cells. As an example, bit 8 of this register controls when the counter for the FGSR select is enabled and incremented per clock cycle of the XCLK clock until it reaches 127 and then the counter rolls over. As another example, bits 4 and 5 of the REG_CTL1 register control whether a full DC charge sequence occurs to all of the 32 cells or whether a selective DC charge sequence occurs on only a subset of the 32 cells.

Figure 9:
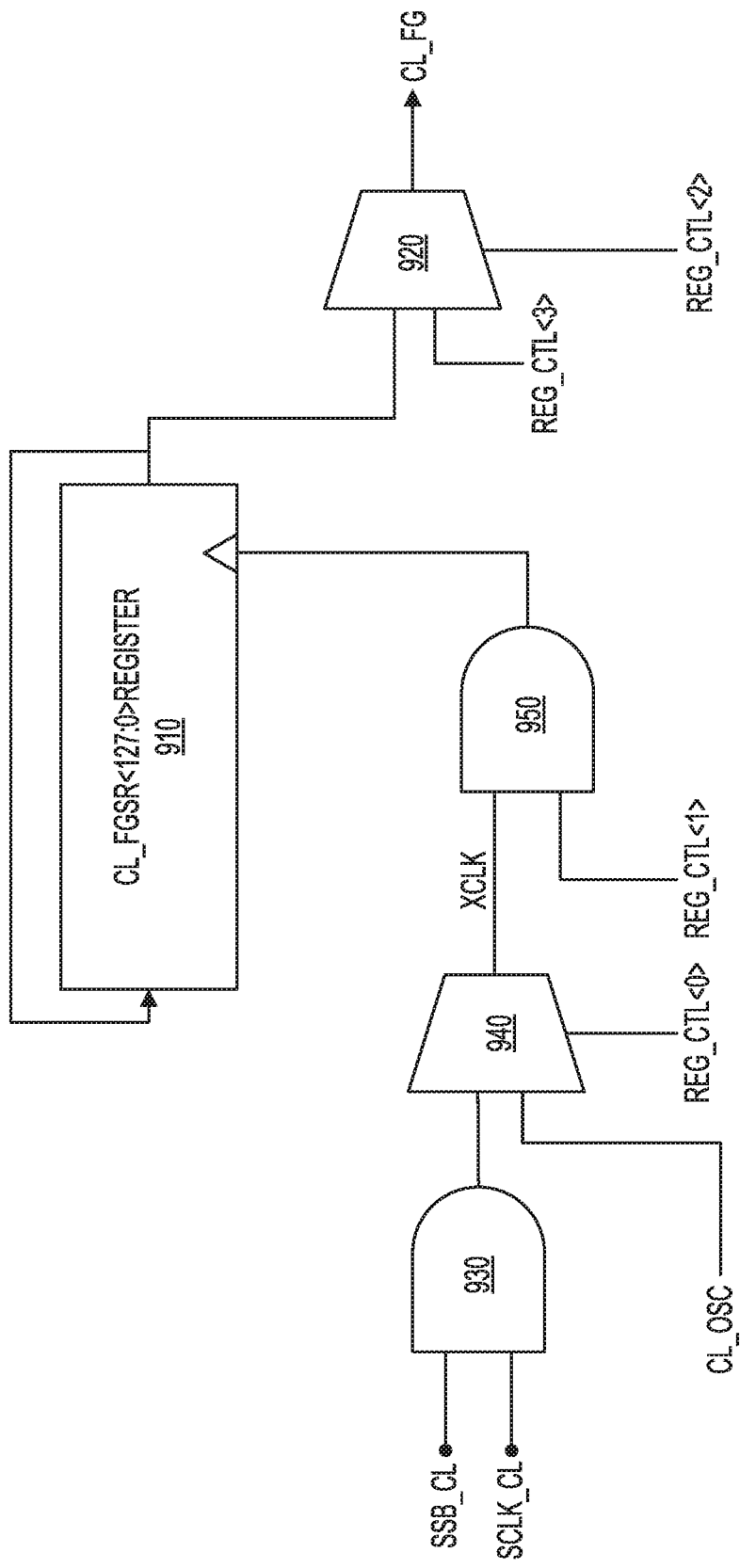
FIG. 9 shows an example of a fast gating circuit.

FIG. 9 shows an example of a fast gating circuit 900. As described earlier, as part of Table 2, four 32-bit registers may control the output of fast gating circuit 900. Fast gating circuit 900 may include a counter 910, a multiplexer 920, which may be coupled to receive the output of counter 910 as one input and the value corresponding to register REG_CTL<3> as another input. Fast gating circuit 910 may further include AND gate 930, multiplexer 940, and gate 950, which may be coupled to each other as shown in FIG. 9. These logic elements may further receive the signals shown in FIG. 9. Counter 910 selects the bit position of the 128-bit value to be output on the CL_FG terminal. In this example, this is a 128-to-1 mux. Each clock cycle (e.g., corresponding to the clock XCLK shown in FIG. 9), counter 910 is incremented by 1. Counter 910 wraps back to 0 and continues counting. The value of the bit stored in REG_CTL [8] enables counter 910. Thus, in this example when REG_CTL[8]=0, the counter remains at 0 and does not increment. If the charge locking state machine is not idle, then the fast gating output CL_FG is 0. The counter continues to increment in this case as long as REG_CTL[8]=1.

With continued reference to FIG. 9, in one example, the programming sequence to update the 128-bit FGSR and start a new fast gating sequence is as follows: (1) clear REG_CTL1[8] to hold counter at 0 or set REG_CTL1[1] to stop XCLK, (2) write new values to the four 32-bit FGSR registers, and (3) set REG_CTL1[8] to allow counter to increment or clear REG_CTL1[1] to resume XCLK. In one example, the FG output can also be overridden. When REG_CTL1[2]=1, the CL_FG output equals REG_CTL1 [3]. Although FIG. 9 shows fast gating circuit 900 with a certain number of components arranged in a certain manner, fast gating circuit 900 may include additional or fewer components arranged differently. In addition, other signals may be used to provide additional or less control.

Figure 10:
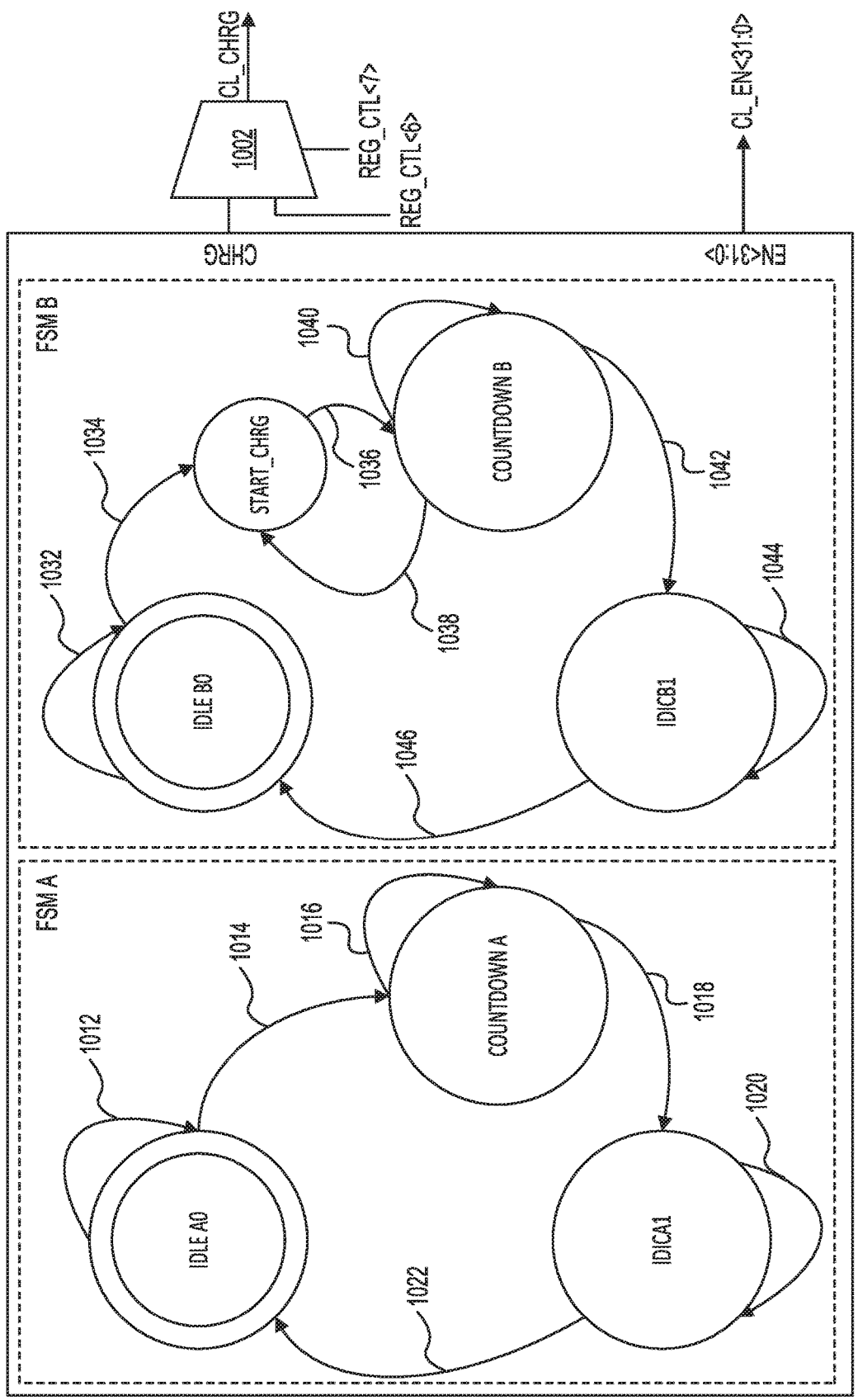
FIG. 10 shows finite state machines for controlling CLFG cells' operation in accordance with one example.

FIG. 10 shows finite state machines 1000 in accordance with one example. In this example, finite state machines 1000 include two finite state machines: FSM A and FSM B. Each of the finite state machines is configured for DC charging of the CLFG cells (e.g., CLFG cell 500). FSM A corresponds to a finite state machine that is configured to concurrently charge only those CLFG cells that are enabled according to the bits in the CL_EN register. FSM B corresponds to a finite state machine that is configured to sequentially charge all of the CLFG cells in the CLFG array (e.g., all of the 32 cells in a CLFG array that has 32 cells). In this example, bit values stored in a register (e.g., bits 4 and 5 of the 32 bit register REG_CTL1 corresponding to the field BEGIN_CHRG described in Table 2) determine which of the two finite state machines is active. In this example, when the BEGIN_CHRG field transitions from 00 to 01 FSM A is activated; alternatively, when the BEGIN_CHRG field transitions from 00 to 10 FSM B is activated. The output signal from both FSM A and FSM B is provided as the CHRG signal, which is coupled to one of the inputs of multiplexer 1002. The other input of multiplexer 1002 comprises the bit value stored in REG_CTL<6> (described in Table 2). The output of multiplexer 1002 is the global DC charge signal and is labeled as CL_CHRG. The value of the bit 7 (e.g., REG_CTL<7>) determines whether the output of FSM A and FSM B is provided as the DC charge signal or whether the DC charge signal is user selected to be the value of bit 6 of the REG_CTL register described in Table 2.

With continued reference to FIG. 10 upon activation, FSM A starts in the IdleA0 state and transitions to the COUNTDOWN A state. As part of this transition, FSM A asserts the CHRG signal and begins a countdown to DC charge those CLFG cells that are enabled. During the entire operation of FSM A, the CL_EN value stays the same as was specified by a user previously. In this example, $i^{th}$ CLFG cell is enabled when the local enable signal for a specific CLFG cell (e.g., CL_EN<i>=1) is high. Thus, by gating the CHRG signal, the local enable signal ensures that the CLFG cell is charged only when it is enabled to be charged. After completion of the charging, FSM A enters idle state IdleA1. Table 3 below shows example correspondence between the transitions/states referenced to in FIG. 10 for FSM A and the example values of the bits and other signals.

TABLE 3

| Transitions referred to in FIG. 10 | Example values of bits and other signals for FSM A |
|---|---|
| 1012 | b4 = 0, b5 = 0; CHRG = 0 |
| 1014 | b4 = 1, b5 = 0; CHRG = 1; Count = REG_DCSR |
| 1016 | b4 = x, b5 = x; CHRG = 1; Count is decremented |
| 1018 | b4 = x, b5 = x; CHRG = 0; Count = 0 |
| 1020 | b4 = 1, b5 = x; CHRG = 0 |
| 1022 | b4 = 0, b5 = x; CHRG = 0 |

Still referring to FIG. 10, upon activation, FSM B enters the START_CHRG state and assuming there are 32 CLFG cells, starts charging of the $32^{nd}$ CLFG cell when CL_EN<32> bit is set to 1 and each of the other enable bits is set to 0. As part of this process, FSM B enters the COUNTDOWN B state and counts down the clock cycles required for sequential charging of the CLFG cells (e.g., the DCSR clock cycles). Except for in states START_CHRG and COUNTDOWN B, during the entire operation of FSM B, the CL_EN value stays the same as was specified by a user previously. When CL_EN<31> bit is set to 1, and rest of the enable bits are set to 0, the DC charging of $32^{nd}$ CLFG cell finishes, and the DC charging of $31^{st}$ CLFG cell starts. In this example, these steps are repeated until all 32 CLFG cells are charged. Then, the FSM B transitions to an idle state (e.g., IdleB1 state). Table 4 below shows example correspondence between the transitions/states referenced to in FIG. 10 for FSM B and the example values of the bits and other signals.

TABLE 4

| Transitions referred to in FIG. 10 | Example values of bits and other signals for FSM B |
|---|---|
| 1032 | b4 = 0, b5 = 0; CHRG = 0 |
| 1034 | b4 = 0, b5 = 1; CHRG = 1; CountCell = 32; EN<31:0> = 0 |
| 1036 | Count = REG_DCSR |
| 1038 | b4 = x, b5 = 1; CHRG = 1; Count = 0; CountCell is decremented by 1 each time; EN<CountCell> = 1; EN<OtherCells> = 0 |
| 1040 | b4 = x, b5= 1; CHRG = 1 Count is decremented |
| 1042 | b4 = x, b5 = x; CHRG = 0; CountCell = 0; EN <31:0> = 0 |
| 1044 | b4 = x, b5 = 1; CHRG = 0 |
| 1046 | b4 = x, b5 = 0; CHRG = 0 |

Although FIG. 10 shows specific finite state machines operating in a certain manner, other state machines may also be used. Although Tables 3 and 4 refer to specific bits and signals and respective values for the two finite state machines, other bits and signals and their respective values may also be used. In addition, the functionality associated with the state machines may be accomplished using other logic or instructions.

Figure 11A:
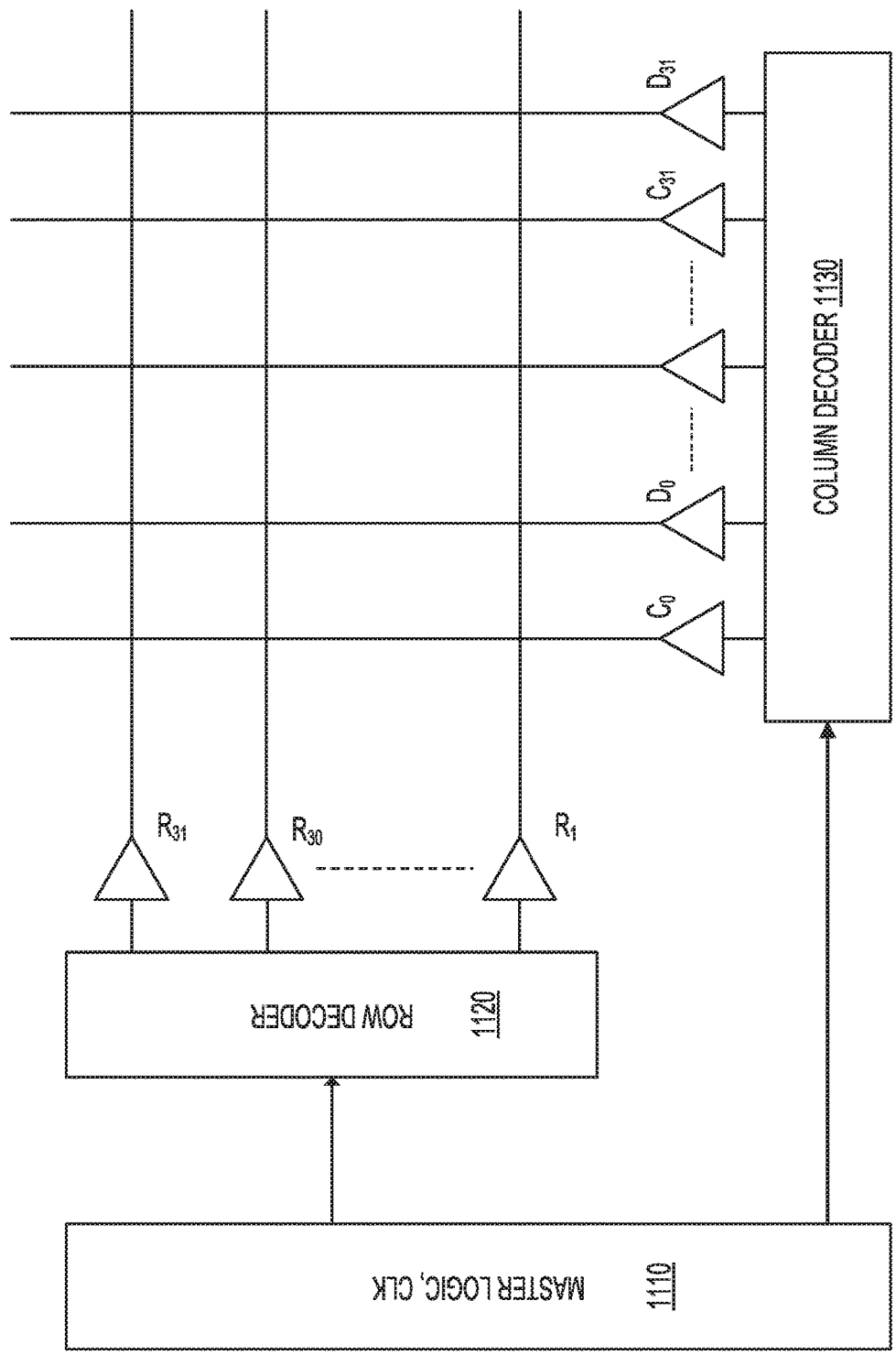
FIGS. 11A and 11B show an example system which may be used to generate enable signals as part of an example cryogenic-CMOS control chip.
Figure 11B:
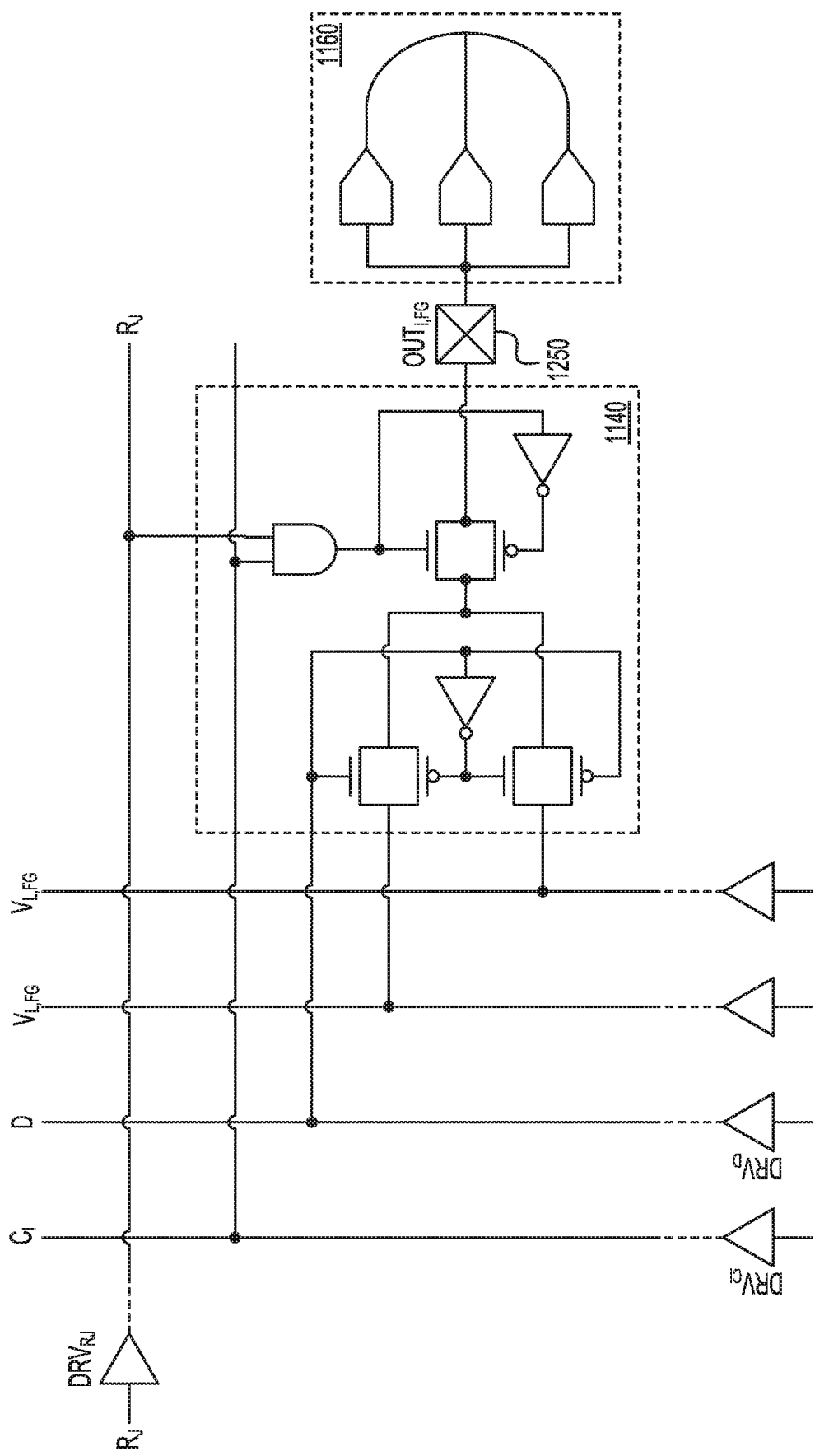

FIGS. 11A and 11B show an example system 1100 which may be used to generate enable signals as part of an example cryogenic-CMOS control chip. An FSM, described earlier, may be used to interface with system 1100, which may be used to generate enable signals that are used to select the CLFG cell that is charged. This example also assumes that there are 1024 CLFG cells (arranged in a grid including 32 rows and 32 columns) that need to be controlled. System 1100 may include a master logic and clock portion 1110, a row decoder 1120, and a column decoder 1130. Master logic and clock portion 1110 may include circuits and logic configured to store and interpret instructions or commands in a manner similar to a memory controller. Row decoder 1120 may be configured to receive a row address from master logic and clock portion 1110 and assert one or more of signals labeled as $R_0$ to $R_{31}$. Column decoder 1130 may be configured to receive a column address from master logic and clock portion 1110 and assert one or more of signals labeled as $C_0$ to $C_{31}$ and $C_0$ to $D_{31}$.

Referring now to FIG. 11B, system 1100 may further include a bus system to couple the signals generated by row decoder 1120 and column decoder 1130 to a circuit 1140. Circuit 1140 may be configured to generate a signal, labeled $OUT_{LFG}$ at its output terminal. This signal may be coupled to a qubit gate 1160. Circuit 1140 is an example implementation similar to the "direct mode" of the CLFG cells described earlier. Thus, in this example, circuit 1160 can be connected to voltage bus $V_{LFG}$ or $V_{HFG}$ when a respective row ($R_J$) signal and a respective column ($C_J$) signal is high and the drive line (D) signal is high or low, respectively.

Circuit 1140 may also be implemented as an array of CLFG cells (e.g., as shown in FIG. 5 and described earlier). Although FIG. 11 shows system 1100 as having certain components arranged in a certain manner, there could be more or fewer components arranged differently.

Figure 12:
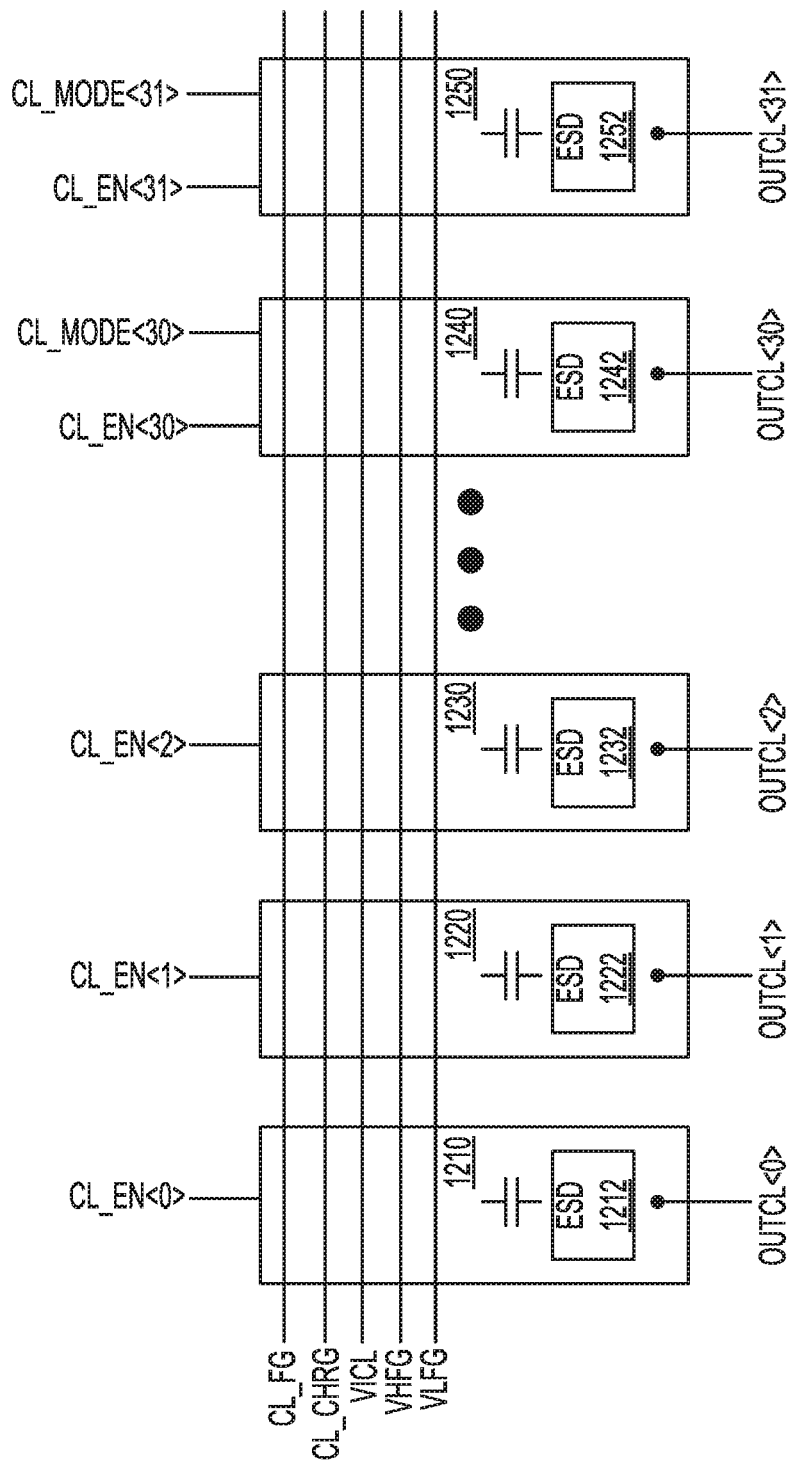
FIG. 12 shows a CLFG cell array in accordance with one example.

FIG. 12 shows a CLFG cell array 1200 in accordance with one example. As an example, CLFG cell array 1200 may correspond to CLFG cell array 760 of FIG. 7 and may be included as part of a cryogenic-CMOS control chip. In this example, CLFG cell array 1200 may include 32 CLFG cells (e.g., CLFG cells 1210, 1220, 1230, 1240, and 1250). Each of these CLFG cells may be configured to generate one of the OUTCL signals, which may be used to provide control or other type of voltages to qubits. Each CLFG cell may receive signals labeled as CL_FG, CL_CHRG, VICL, VHFG, and VLFG. These signals are described more in detail with respect to FIG. 13 and FIG. 14. In addition, some of these signals have also been described earlier as part of the description associated with the cryogenic-CMOS control chip. Each CLFG cell may also receive an enable signal (e.g., CL_EN<0>, CL_EN<1>, CL_EN<2>, CL_EN<30>, or CL_EN<31>, as shown in FIG. 12). The enable signals may allow selective or sequential DC charging as explained earlier with respect to the finite state machines description in FIG. 10. Each of the CLFG cells shown in FIG. 12 may also include electrostatic discharge (ESD) circuitry, including ESD circuits 1212, 1222, 1232, 1242, and 1252. The CLFG cells may operate either in the capacitive mode only or in a dual mode, including both the capacitive mode and the direct mode. As an example, CLFG cell array 1200 may consist of 32 CLFG cells—16 CLFG cells configured to operate in the capacitive mode and 16 CLFG cells configured to operate in the direct mode. In one example, half of each type of CLFG cells may also incorporate a custom analog pad with a reduced ESD protection to further minimize leakage through the standard pad structure. Although FIG. 12 shows CLFG cell array 1200 as having certain components arranged in a certain manner, there could be more or fewer components arranged differently.

Figure 13:
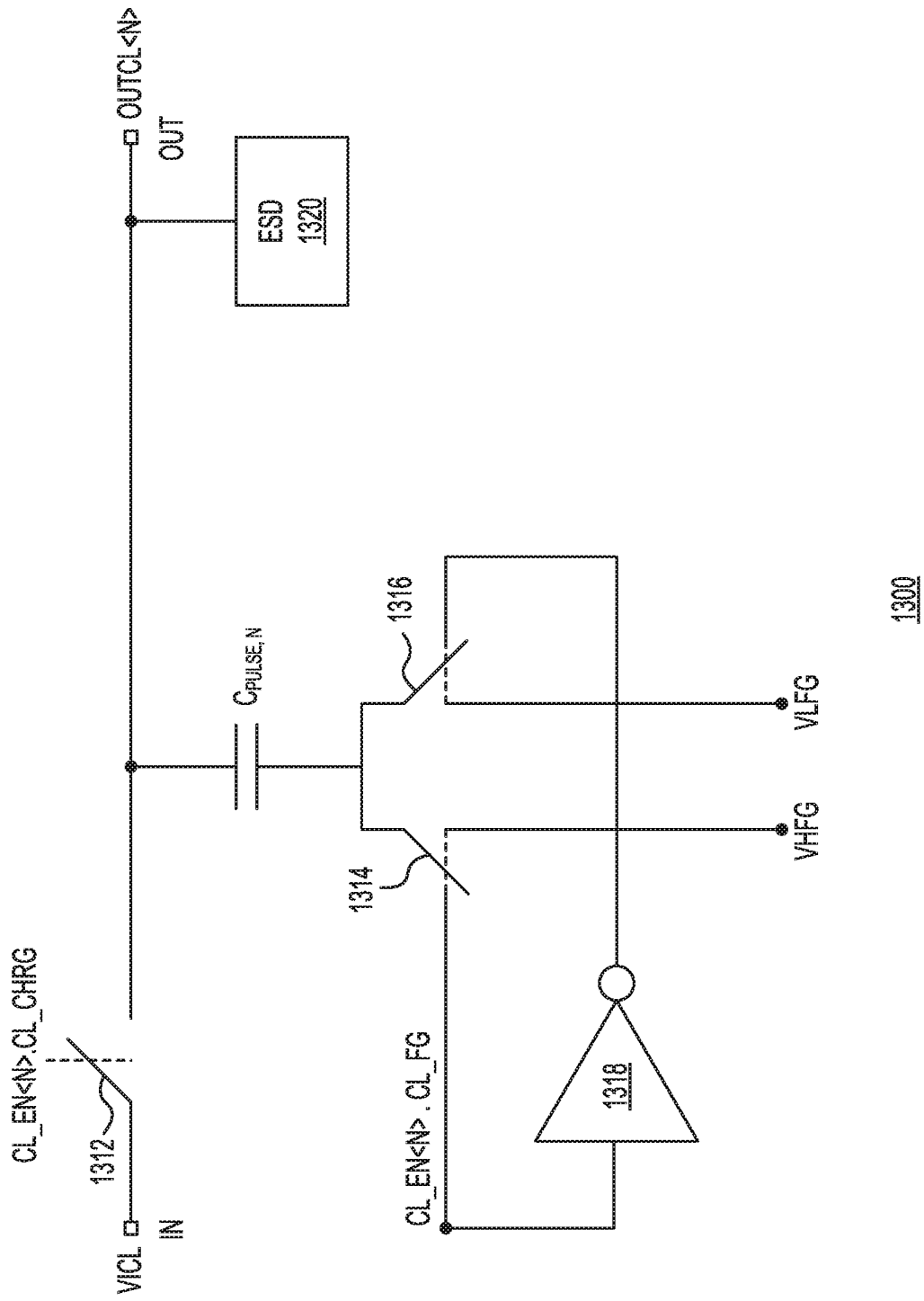
FIG. 13 shows an example CLFG cell configured to operate in a capacitive mode in accordance with one example.

FIG. 13 shows an example of CLFG cell 1300 configured to operate in a capacitive mode in accordance with one example. Unless indicated otherwise, the signals referred to in FIG. 13 have the same meaning as described earlier with respect to FIGS. 5-7B and Tables 1 and 2. CLFG cell 1300 is configured in a similar manner as CLFG cell 500 of FIG. 5. CLFG cell 1300 is configured to lock charge and provide a voltage output at the output terminal (OUT) associated with the CLFG cell. Each CLFG cell 1300 may correspond to any of N number of cells. A dynamic voltage (based on one of voltage received via the VHFG terminal (referred to as $V_{HIGH}$ in FIG. 5) or a voltage received via the VLFG terminal (referred to as $V_{LOW}$ in FIG. 5)) may be coupled to the output terminal. CLFG cell 1300 may include a switch 1312, which may be operated in response a signal CL_EN<N> signal. This signal may be provided under the control of an appropriate finite state machine or another type of control logic as described with respect to FIG. 10. When switch 1312 is closed the voltage (referred to as $V_{HOLD}$ in FIG. 5) is received via the input terminal (IN) on signal line VIOL may be coupled to one plate of the capacitor labeled $C_{PULSE, N}$, which represents the on-chip capacitance. CLFG cell 1300 may further include a switch 1314 and a switch 1316. CLFG cell 1300 may further include an inverter 1318. CLFG cell 1300 may be configured such that only one of these switches is closed at a time. In this example, the signal that is labeled CL_EN<N> may control switch 1314 and an inverted version of this signal (e.g., inverted by inverter 1318) may control switch 1316. This way at a time either voltage $V_{HIGH}$ or voltage $V_{LOW}$ may be coupled via one of the two switches to the second plate of capacitor labeled $C_{PULSE, N}$, which represents the on-chip capacitance. CLFG cell 1300 may further include an ESD 1320 coupled to the output terminal (OUT). CLFG cell 1300 operates only in the capacitive mode since the output voltage supplied to a qubit gate is provided via the capacitive arrangement shown in FIG. 13. Although FIG. 13 shows certain number of components arranged in a certain manner, CLFG cell 1300 may include additional or fewer components arranged differently. As an example, CLFG cell 1300 may not include ESD 1320.

Figure 14:
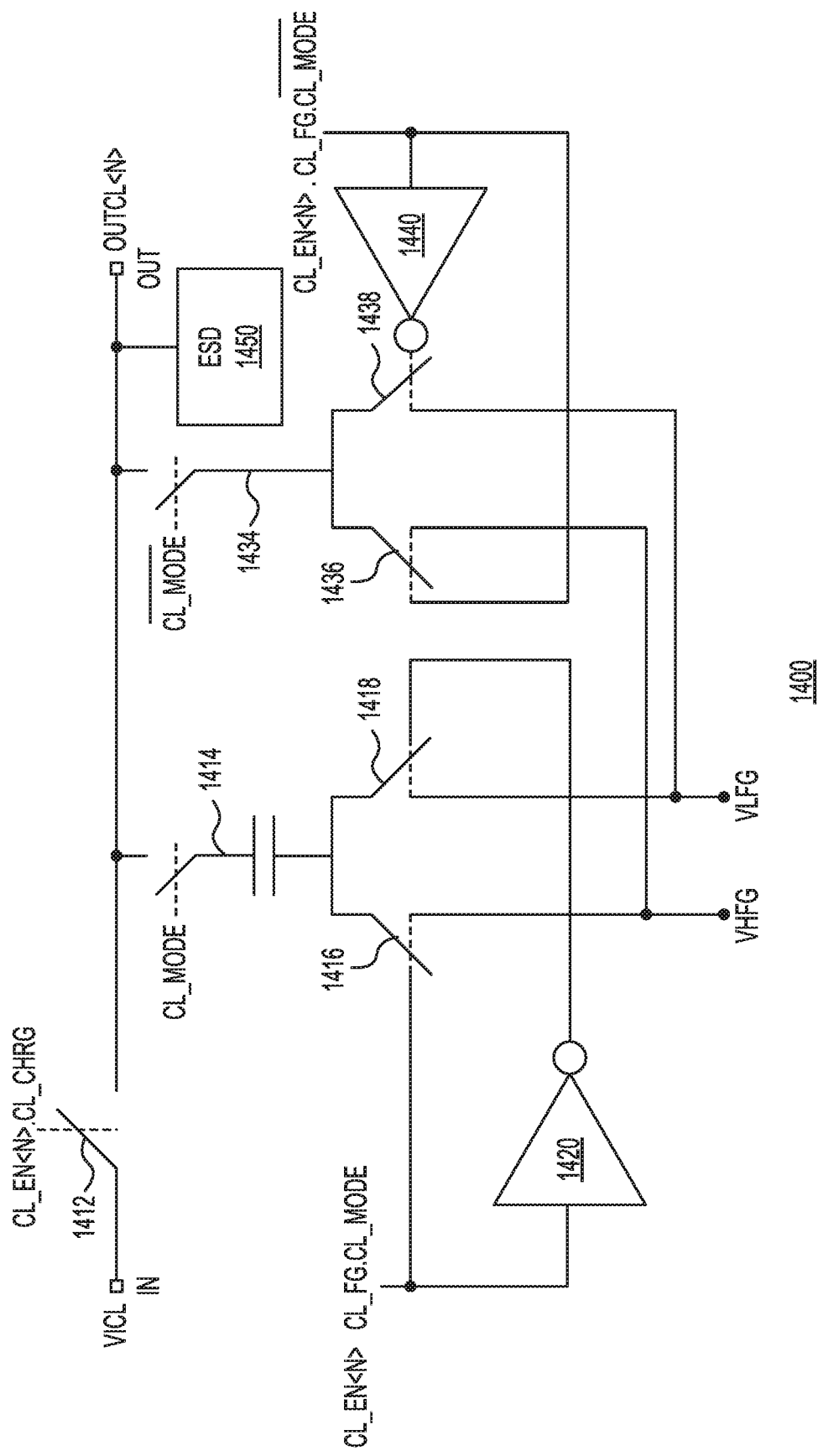
FIG. 14 shows an example CLFG cell configured to operate in a dual mode, including both a capacitive mode and a direct mode, in accordance with one example.

FIG. 14 shows an example of CLFG cell 1400 configured to operate in a dual mode including both a capacitive mode and a direct mode in accordance with one example. Unless indicated otherwise, the signals referred to in FIG. 14 have the same meaning as described earlier with respect to FIGS. 5-7B and Tables 1 and 2. CLFG cell 1400 is configured to lock charge and provide a voltage output at the output terminal (OUT) associated with the CLFG cell. Each CLFG cell 1400 may correspond to any of N number of cells. In the capacitive mode (enabled by the assertion of the signal labeled CL_MODE asserted via switch 1414), a dynamic voltage (based on one of voltage received via the VHFG terminal (referred to as $V_{HIGH}$ in FIG. 5) or a voltage received via the VLFG terminal (referred to as $V_{LOW}$ in FIG. 5)) may be coupled to the output terminal. CLFG cell 1400 may include a switch 1416, which may be operated in response to the CL_EN<N> signal. This signal may be provided under the control of an appropriate finite state machine or another type of control logic as described with respect to FIG. 10. When switch 1416 is closed the voltage (referred to as $V_{HOLD}$ in FIG. 5) received via the input terminal (IN) on signal line VICL may be coupled to one plate of the capacitor labeled $C_{PULSE, N}$, which represents the on-chip capacitance. CLFG cell 1400 may further include a switch 1416 and a switch 1418. CLFG cell 1400 may further include an inverter 1420. CLFG cell 1400 may be configured such that only one of these switches—1416 and 1418—is closed at a time. In this example, the signal that is labeled CL_EN<N> may control switch 1416 and an inverted version of this signal (e.g., inverted by inverter 1420) may control switch 1418. This way at a time either voltage $V_{HIGH}$ or voltage $L_{LOW}$ may be coupled via one of the two switches to the second plate of capacitor labeled $C_{PULSE, N}$, which represents the on-chip capacitance. When CL_MODE signal is asserted, CLFG cell 1400 operates in the capacitive mode since the output voltage supplied to a qubit gate is provided via the capacitive arrangement shown in FIG. 14.

With continued reference to FIG. 14, CLFG cell 1400 may operate in the direct mode when the CL_MODE signal is de-asserted. Thus, when the CL_MODE signal is de-asserted, switch 1434 is closed and depending on a status of the CL_EN<N> signal, either switch 1436 or switch 1438 is closed. As a result, at a time either voltage $V_{HIGH}$ or voltage $V_{LOW}$ may be coupled via one of the two switches to the same terminal to which the $V_{IN}$ voltage via the input terminal (IN) is coupled. CLFG cell 1400 may further include an ESD 1450 coupled to the output terminal (OUT). Although FIG. 14 shows certain number of components arranged in a certain manner, CLFG cell 1400 may include additional or fewer components arranged differently. As an example, CLFG cell 1400 may not include ESD 1450.

In the cases of both CLFG cell 1300 and CLFG cell 1400, once the capacitors are charged, the low leakage in the cryogenic environment ensures that they need to be refreshed less frequently. Each of the CLFG cells may receive voltage from a single DAC. The single DAC voltage may be used to charge all of the CLFG cells (e.g., 32 CLFG cells in the example described earlier) using a similar technique as rasterizing a display. Thus, in this example, the DAC voltage is provided to a capacitor by closing a switch in the pathway between the DAC voltage line and the capacitor; after the capacitor is charged, the switch is opened and the DAC voltage is used to charge the next capacitor in a round-robin fashion. By using a shared DAC, the number of the input/output lines between the control chip, including the CLFG cell array, and the room temperature electronics is significantly reduced. As described earlier, the interconnections between the cryogenic-CMOS control chip and the qubit plane are formed using wire bonding, flip-chip bonding or other low impedance interconnect techniques.

Figure 15:
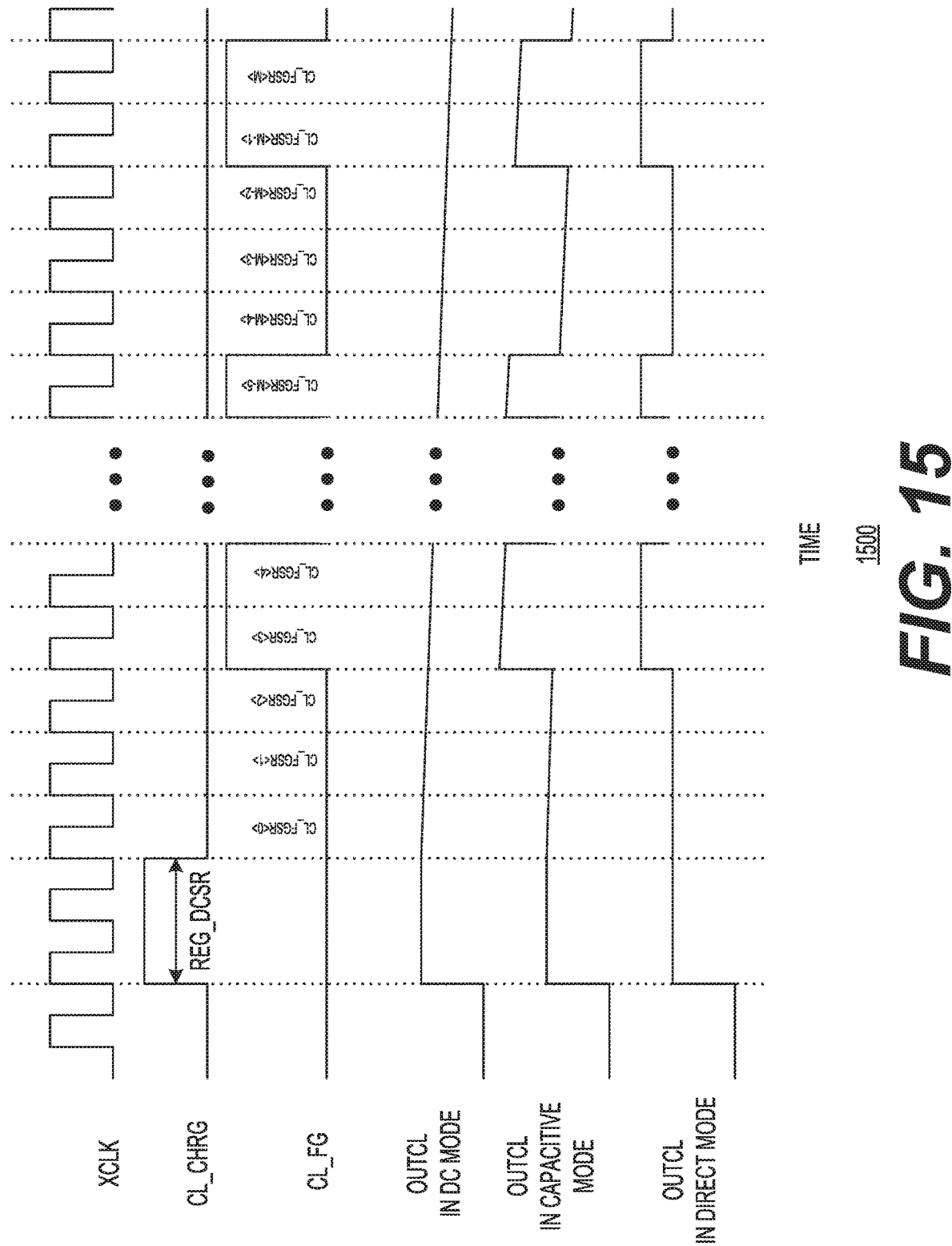
FIG. 15 shows example waveforms associated with the signals for the CLFG cells shown in FIG. 13 and FIG. 14.

FIG. 15 shows example waveforms 1500 associated with the signals for CLFG cell 1300 and CLFG cell 1400. In this example, each of CLFG cell 1300 and CLFG cell 1400 is shown as operating in relation to the clock labeled XCLK. The CL_CHRG signal is asserted for a time period based on the clock cycles (or another metric) specified in a control register (e.g., REG_DCSR) associated with the cryogenic-CMOS control chip. The CL_FG control signal is used for charge shuffling. For CLFG cell 1300 and for CLFG cell 1400, whenever this control signal is high, the voltage at the OUTCL terminal pulses between VICL+the difference between $V_{HIGH}$ voltage and the $V_{LOW}$ voltage. Whenever the CL_FG control signal is low, both CLFG cell 1300 and CLFG cell 1400 operate in the DC mode, such that the output voltage (represented by the waveform labeled OUTCL in DC MODE) is held at a voltage to which the capacitor is initially charged (e.g., by the CL_CHRG signal) and it, in the absence of a refresh, may dissipate over time. The waveform labeled OUTCL in CAPACITIVE MODE shows the output signal of CLFG cell 1300. This same waveform also shows the output of CLFG cell 1400 when it operates in the capacitive mode. The waveform labeled OUTCL in DIRECT MODE shows the output signal of CLFG cell 1400 when it operates in the direct mode. Each of these modes are explained earlier with respect to FIGS. 13 and 14.

With continued reference to FIG. 15, a fast gating operating cycle using CLFG 1400 in the capacitive mode includes a DC charging of the storage capacitor, followed by a series of pulses. In one example, the DC charging period is determined by the REG_DCSR value. The period and number of the pulses is determined by the content of the CL_FGSR register (explained earlier), which is set to 128 bits. In this example, the contents of this register are read one bit at a time (e.g., by a waveform generator) and applied as a control signal labeled: CL_FG. When using direct drive mode, fast gating consists of a series of pulses where the output is directly connected to VLFG or VHFG. In the direct drive mode, the charge cycle is still present and behaves the same as a value of "0" on CL_FGSR. Each of these modes is explained earlier with respect to FIGS. 13 and 14.

Figure 16:
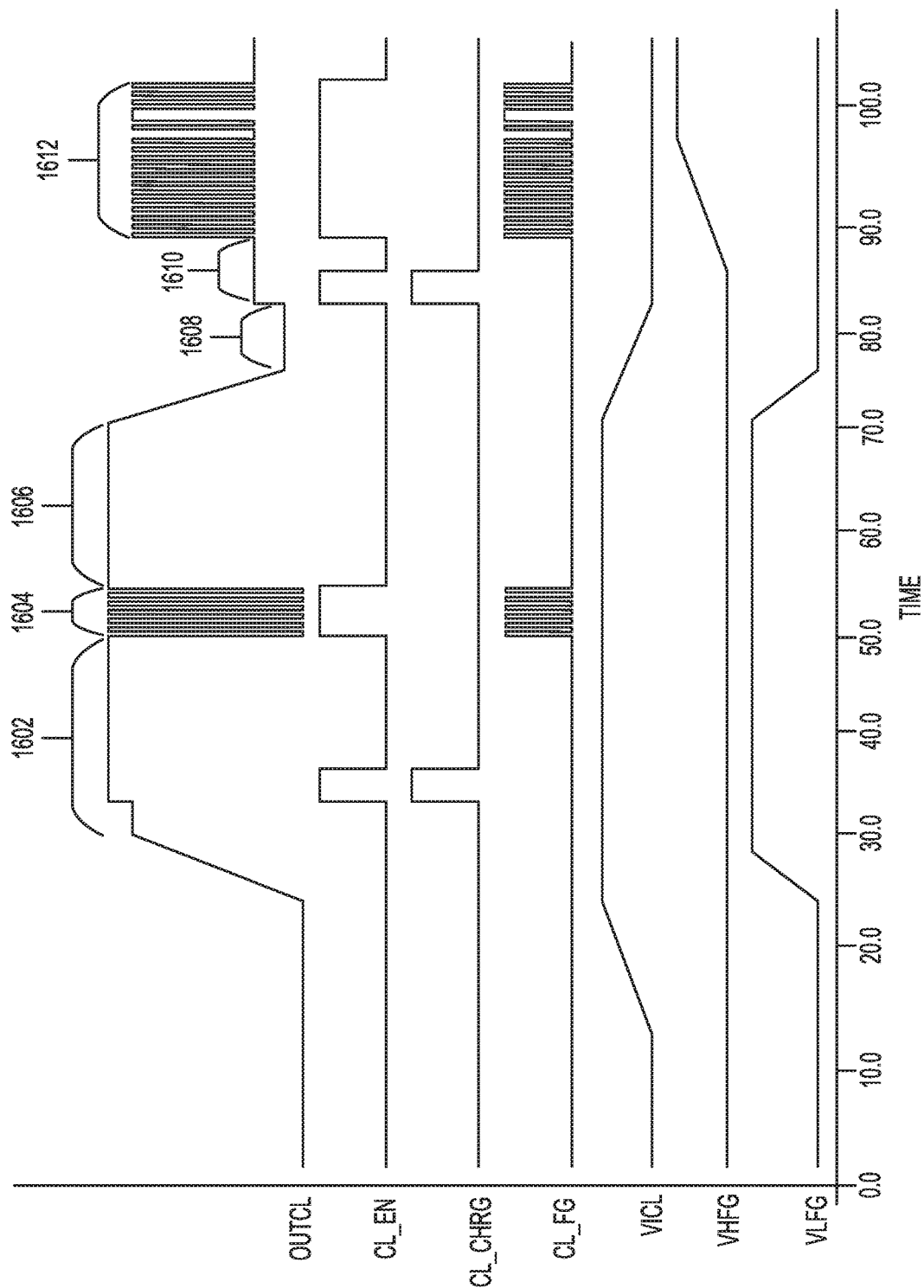
FIG. 16 shows example waveforms associated with the simulation of a CLFG cell in the capacitive mode.

FIG. 16 shows example waveforms 1600 associated with the simulation of CLFG cell 1400 in the capacitive mode. The waveform labeled OUTCL represents the simulated output signal of CLFG cell 1400 when operating in the capacitive mode. The waveform labeled CL_EN corresponds to the enable signal, which is used to enable a CLFG cell for charging. The CL_CHRG signal is used to charge the capacitor (or capacitors) associated with a CLFG cell. As explained earlier, the CL_CHRG signal is asserted for a time period based on the clock cycles (or another metric) specified in a control register (e.g., REG_DCSR) associated with the cryogenic-CMOS control chip. For CLFG cell 1400, whenever CL_FG control signal is high, the voltage at the OUTCL terminal pulses between VICL+the difference between $V_{HIGH}$ voltage and the $V_{LOW}$ voltage. The VICL voltage corresponds to the voltage at an input terminal of the CLFG cell, which may be received from a DAC (as explained earlier). The $V_{HIGH}$ voltage is received via the VHFG terminal and the waveform is also labeled as VHFG in FIG. 16. The $V_{LOW}$ voltage is received via the VLFG terminal and the waveform is also labeled as VLFG in FIG. 16.

With continued reference to FIG. 16, portion 1602 of the OUTCL waveform shows the locking of a DC voltage (e.g., 1.8 Volts) in the CLFG cell. Portion 1604 of the OUTCL waveform shows fast gating of the voltages to generate pulses that can be used as control signals for qubits. Portion 1606 shows restored locked DC voltage after the generation of the pulses. Portion 1608 shows the voltage at the OUTCL terminal when the locked DC voltage is not refreshed or restored. Portion 1610 shows the locking of a different level of DC voltage (e.g., 0.6 Volts) from the level of voltage locked in portion 1602. Portion 1612 shows the fast gating of the voltages to generate pulses, having a different magnitude, which can also be used for controlling qubits or other such devices. Although FIG. 16 shows the OUTCL waveform as having rectangular pulses, the pulses may have a different shape. Although FIG. 16 shows the OUTCL waveform having two different magnitudes, the OUTCL waveform may have other variations in the magnitude. Similarly, the frequency of pulsing of the OUTCL waveform may also be controlled via the cryogenic-CMOS control chip described earlier. In addition, the OUTCL waveform may be used to modulate a high frequency signal, for example, a microwave tone to generate control signals for a qubit gate or another type of qubit device.

Figure 17:
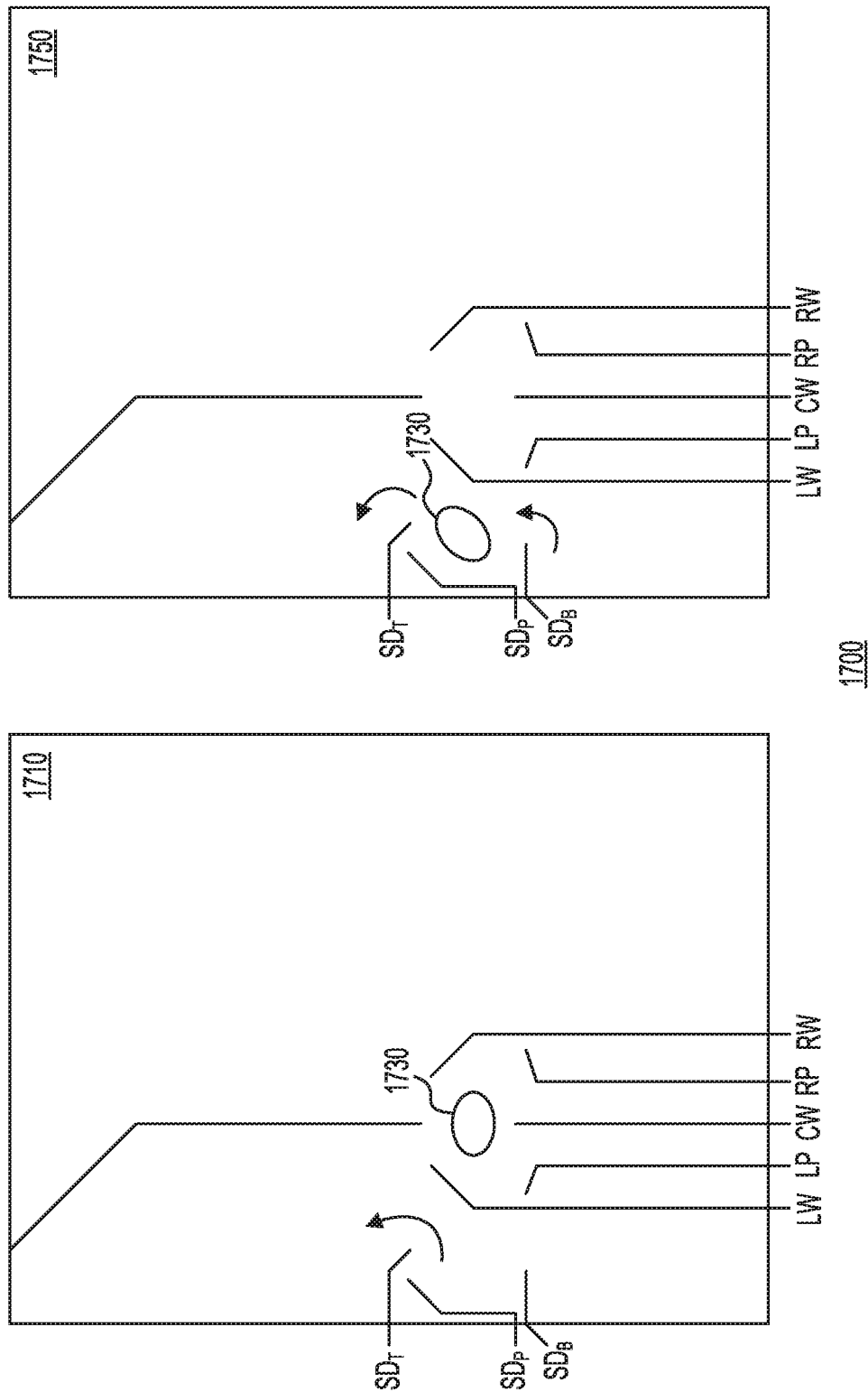
FIG. 17 shows a first view and a second view of an active area of an example qubit device during a charge locking test.

FIG. 17 shows a first view 1710 and a second view 1750 of an active area of an example qubit device 1700 during a charge locking test. Qubit device 1700 may be a gallium-arsenide (GaAs) based quantum dot device. In this example, as shown in view 1710 and view 1750, multiple signals may be used to control the quantum dot. The cryogenic-CMOS control chip described earlier may be used to generate any of the control signals using either the capacitive mode or the direct mode associated with the CLFG cells described earlier. The signals for controlling the qubit may include a left wall (LW) signal, a left plunger (LP) signal, a center wall (CW) signal, a right plunger (RP) signal, and a right wall (RW signal). Additional signals related to sensing the quantum dot 1730 in the qubit gate may include sensing dot top gate ($SD_T$), sensing dot plunger ($SD_P$), and sensing dot bottom gate ($SD_B$). In this example, as shown in view 1710, the potential of control signals LW, LP, CW, RP, and RW may be locked using five CLFG cells based on a programmed finite state machine. Although FIG. 17 shows qubit device 1700 with certain control signals, other types of qubit devices having other control signals may also be subjected to the voltages generated by the cryogenic-CMOS control chip described earlier.

Figure 18:
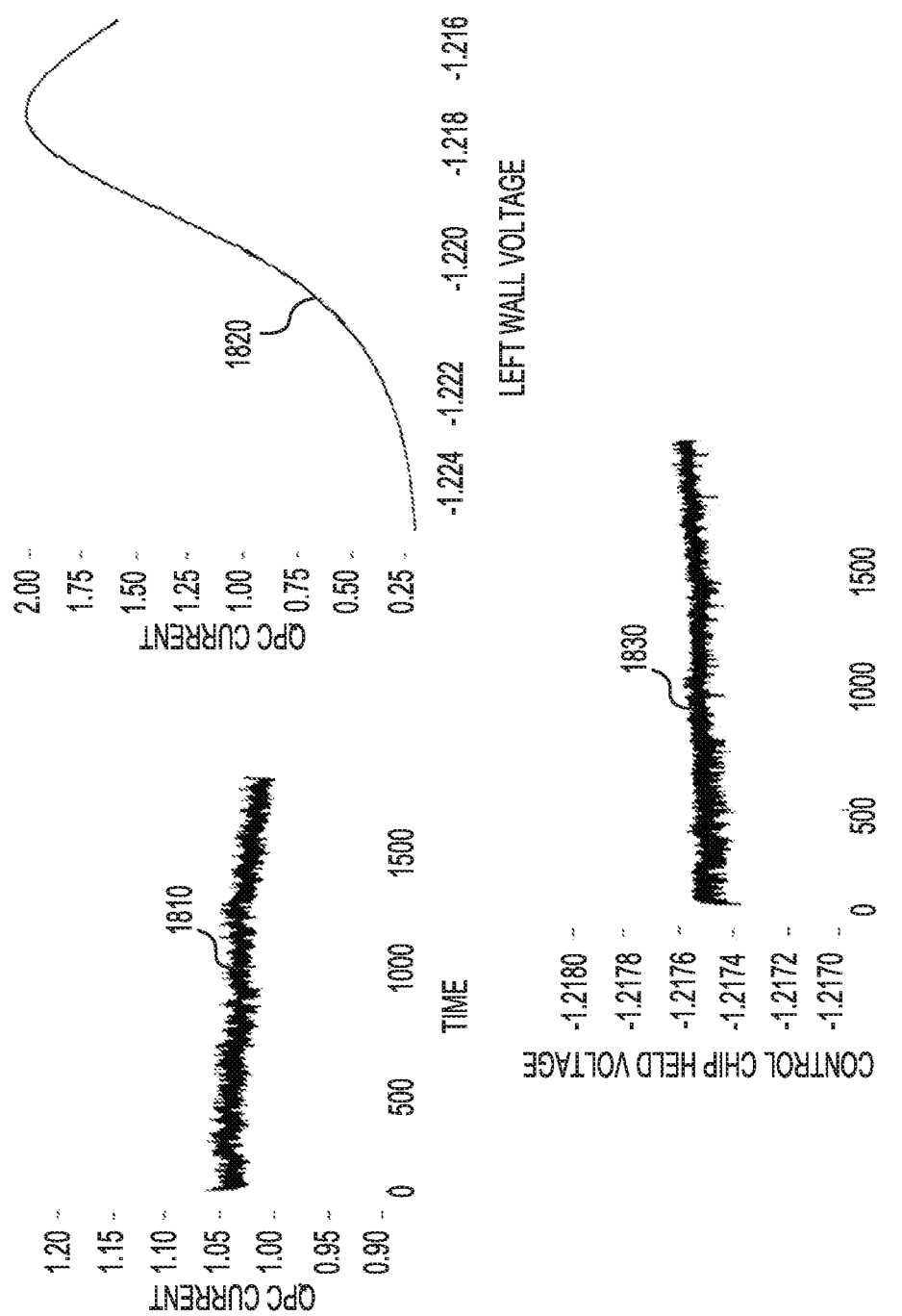
FIG. 18 shows a view of changes in the voltage and the current associated with a quantum point contact (QPC) in accordance with one example.

FIG. 18 shows a view 1800 of changes in the voltage and the current associated with the quantum point contact (QPC) in accordance with one example. Graph 1810 shows the change in the QPC current with time. Graph 1820 shows the change in the QPC current as a function of the change in the left wall voltage. Graph 1830 shows the change in the cryogenic-CMOS control chip held voltage with time.

Figure 19:
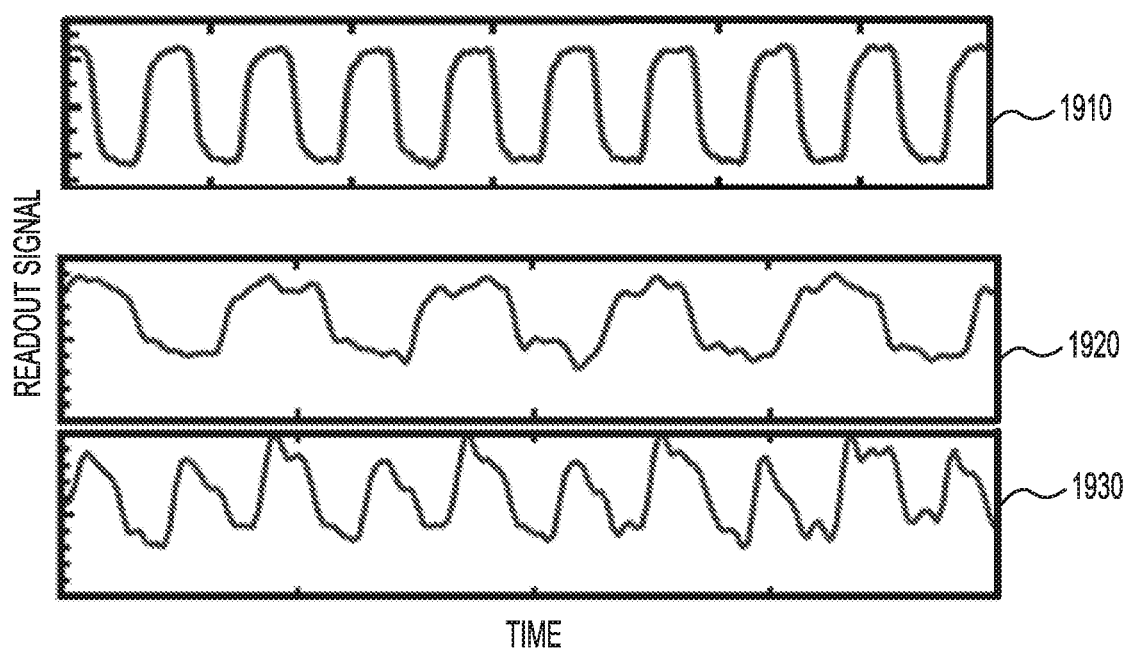
FIG. 19 shows example waveforms corresponding to a cryogenic-CMOS control chip during testing of the fast gating operation with a quantum dot.

FIG. 19 shows example waveforms 1900 corresponding to a cryogenic-CMOS control chip during testing of the fast gating operation with a quantum dot. Example waveform 1910 corresponds to the readout signal when the fast gating is performed at 140 KHz. Example waveform 1920 corresponds to the readout signal when the fast gating is performed at 1.26 MHz. Example waveform 1930 corresponds to the readout signal when the fast gating is performed at 2.45 MHz. The frequency can be varied using a frequency divider. The waveforms do not share a common time scale. Although FIG. 19 shows a certain duty cycle and amplitude of the voltage pulses associated with the waveforms, the duty cycle and the amplitude can be varied by the cryogenic-CMOS control chip. This advantageously removes the need for the control of the qubit gates from the room temperature equipment.

Controlling of the qubit gates from the room temperature would require attenuating the voltage pulses generated at the room temperature, resulting in a requirement to dissipate a large amount of heat from the room temperature voltage pulses. In addition, rather than requiring the voltage signals from the room temperature to deal with the load of a meter long (or longer) cable (e.g., 50 Ohms transmission line with greater than 200 pF in terms of the capacitive load), the cryogenic-CMOS control chip only needs to handle the capacitance of the flip-chip bonds and the very short interconnects between the control chip and the qubit gates. This capacitance may be as low as 0.1 pF. This allows the cryogenic-CMOS control chip to control the state of thousands of qubits without requiring large amounts of dissipation of heat. In addition, the power dissipation from fast gating is small and thus it allows the control chip to manage potentially thousands of qubits efficiently. In terms of the power requirements for the control of the qubits, in one example, assuming the readout clock frequency is set at 1 MHz, the qubit interconnect has a capacitance of 1 pF, then the power consumption per 1000 qubit gates for a 0.1 volt pulse is 10 pW. Assuming 10 gates per qubit, 1 mW of power can be used to control 10,000 qubits at a clock frequency of 1 MHz or 1000 qubits at a clock frequency of 10 MHz.

Figure 20:
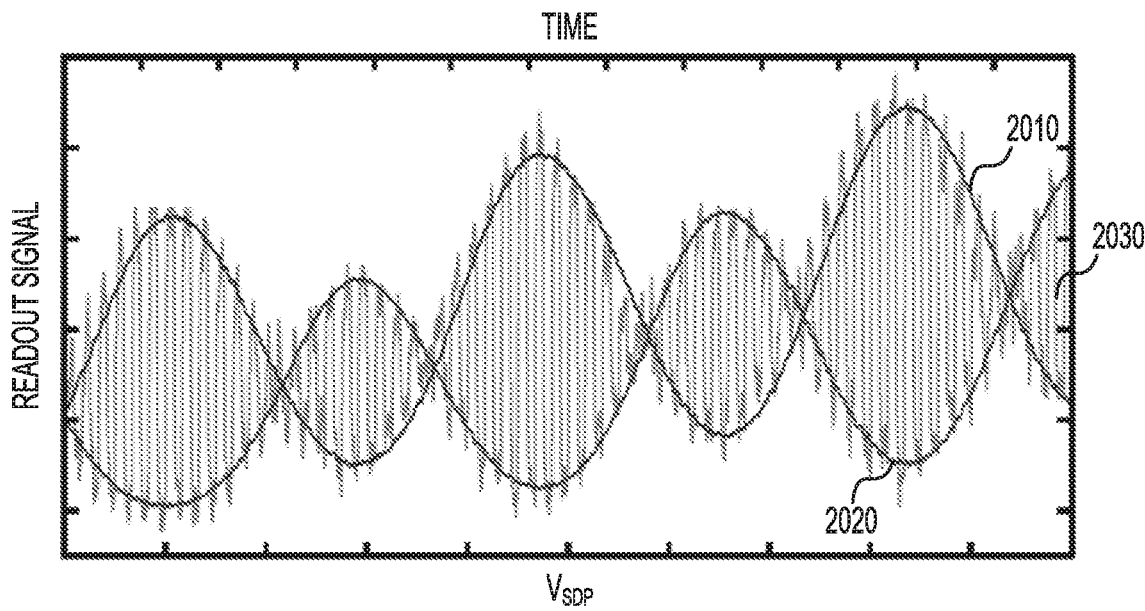
FIG. 20 shows example readout waveforms corresponding to the readout signal through a quantum dot during testing of the cryogenic-CMOS control chip.

FIG. 20 shows example readout waveforms 2000 corresponding to the readout signal through a quantum dot during testing of the cryogenic-CMOS control chip. Waveforms 2000 are generated when the CLFG cell voltages $V_{HIGH}$ and $V_{LOW}$ are used to generate the pulses for controlling the quantum dot and the voltage on the sensing dot plunger $(SD_P)$ gate is swept. Waveform 2010 shows the variation in the $V_{HIGH}$ voltage and waveform 2020 shows the variation in the $V_{LOW}$ voltage. Waveform 2030 shows the pulses applied to the CLFG cell.

Figure 21:
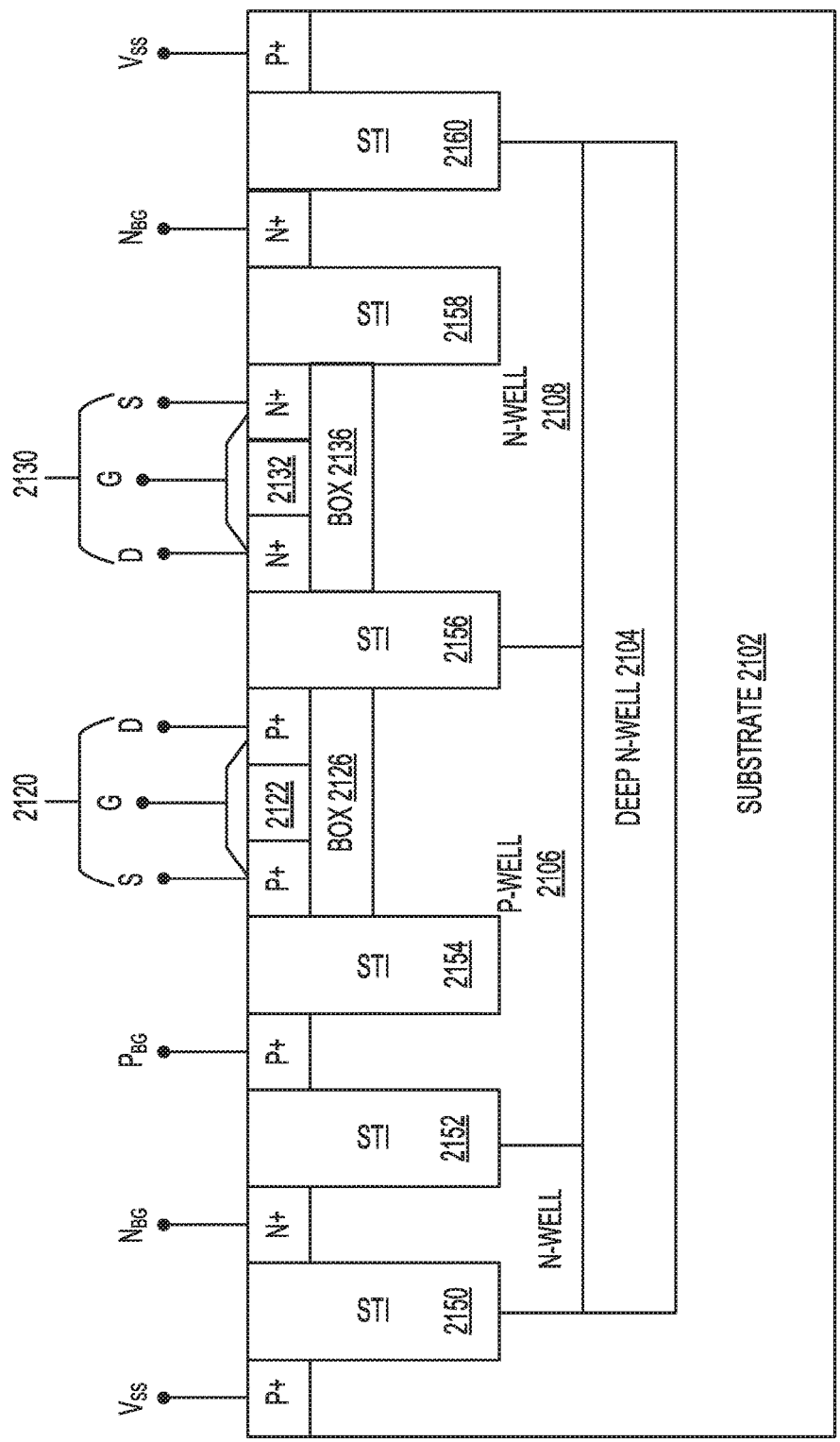
FIG. 21 shows an FDSOI digital device in accordance with one example.

As described earlier, in one example, the cryogenic-CMOS control chip may be implemented using the fully-depleted semiconductor on insulator (FDSOI) process. In one example, the FDSOI process-based devices may include an undoped gate channel, an ultra-thin body, an ultra-thin buried oxide (BOX) below the source, drain, and the gate, and complete dielectric isolation from the adjacent devices. As explained earlier, FDSOI process-based devices may include both digital and analog devices (e.g., transistors or other devices). FIG. 21 shows an FDSOI digital device 2100 in accordance with one example. FDSOI digital device 2100 may include a substrate 2102. In this example, substrate 2102 may be a silicon-on-insulator (SOI) substrate. A deep n-well 2104 may be formed in substrate 2102 by doping substrate with an n-type dopant. Additional wells may be formed in substrate 2102 and deep n-cell 2104. As an example, p-well 2106 and n-well 2108 may be formed. Next, using several lithographic steps, transistor device 2120 and transistor device 2130 may be formed. In this example, transistor device 2120 is a p-type transistor with a gate channel 2122 formed above a box 2126. Transistor device 2120 may further include p+ type source/drain regions and contacts S and D to the source/drain. In this example, transistor device 2130 is an n-type transistor with a gate channel 2132 formed above a box 2136. Transistor device 2130 may further include n+ type source/drain regions and contacts S and D to the source/drain. The capacitors used for charge storage may be implemented using such transistor devices. Various types of devices and regions may be isolated using shallow trench isolation (STI) regions formed using a dielectric. Example STI regions formed in FDSOI digital device 2100 include STI 2150, STI 2152, STI 2154, STI 2156, STI 2158, and STI 2160.

With continued reference to FIG. 21, the back-gate or body bias of each transistor device can be used to configure the threshold voltage dynamically to account for effects associated with cooling. Thus, in this example, FDSOI digital device 2100 includes back gate bias via the $N_{BG}$ terminal for the n-type devices and back gate bias via the $P_{BG}$ terminal for the p-type devices. In this example, while FDSOI digital device 2100 includes the ability to vary the back-gate bias for both the n-type and the p-type devices, the back gate voltage of the n-type devices is not allowed to be lower than the back-gate voltage of the p-type devices.

Still referring to FIG. 21, the back-gate or body bias of each transistor device can be used to configure the threshold voltage dynamically to account for the effects associated with the cooling of the chip in a cryogenic environment. The transistor devices and the related control circuits are designed such that using the back-gate bias control, the threshold voltage of the transistor devices can be tuned despite the huge change in the operating temperature of the transistor devices. The cryogenic-CMOS control chip may include circuit blocks that are partitioned into domains that are given common back-gate bias. Example domains with separate bias include circuit blocks for n-type devices, circuit blocks for p-type devices, circuit blocks for analog devices, and circuit blocks for digital devices. In some examples, different back gate bias is provided for transistors with different aspect ratios. Although FIG. 21 shows FDSOI digital device 2100 including certain number and type of wells, FDSOI digital device 2100 may include additional or fewer wells of other types. In addition, the transistor devices may be planar or non-planar (e.g., FinFET devices).

Figure 22:
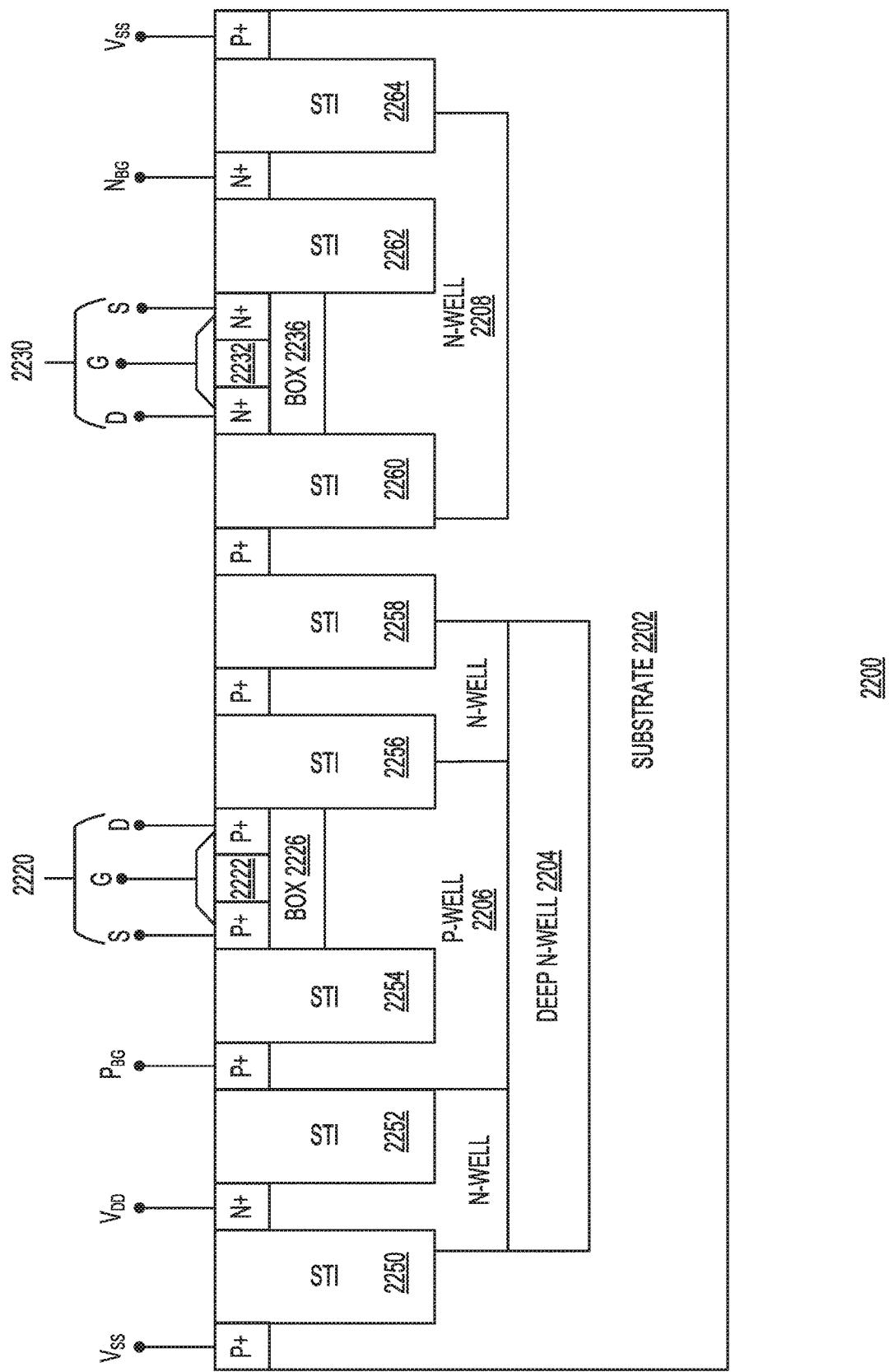
FIG. 22 shows an FDSOI analog device in accordance with one example.

FIG. 22 shows an FDSOI analog device 2200 in accordance with one example. Unlike FDSOI digital device 2100, FDSOI analog device 2200 includes independent back-gate bias control where the back-gate voltage for the p-type devices can be raised above the voltage $V_{DD}$, independent of the back gate voltage for n-type transistors. FDSOI analog device 2200 may include a substrate 2202. In this example, substrate 2202 may be a silicon-on-insulator (SOI) substrate. A deep n-well 2204 may be formed in substrate 2202 by doping substrate with an n-type dopant. A p-well 2206 may be formed in deep n-well 2204 and an n-well 2208 may be formed in substrate 2202. Next, using several lithographic steps, transistor device 2220 and transistor device 2230 may be formed. In this example, transistor device 2220 is a p-type transistor with a gate channel 2222 formed above a box 2226. Transistor device 2220 may further include p+ type source/drain regions and contacts S and D to the source/drain. In this example, transistor device 2230 is an n-type transistor with a gate channel 2232 formed above a box 2236. Transistor device 2230 may further include n+ type source/drain regions and contacts S and D to the source/drain. Various type of devices and regions may be isolated using shallow trench isolation (STI) regions formed using a dielectric. Example STI regions formed in FDSOI analog device 2200 include STI 2250, STI 2252, STI 2254, STI 2256, STI 2258, STI 2260, STI 2262, and STI 2164.

With continued reference to FIG. 22, the back-gate or body bias of each transistor device can be used to configure the threshold voltage dynamically to account for effects associated with cooling. Thus, in this example, FDSOI analog device 2200 includes back gate bias via the $N_{BG}$ terminal for the n-type devices and back gate bias via the $P_{BG}$ terminal for the p-type devices. In this example, unlike FDSOI digital device 2100, FDSOI analog device 2200 includes independent back-gate bias control where the back-gate voltage for the p-type devices can be raised above the voltage $V_{DD}$, independent of the back gate voltage for n-type devices.

Still referring to FIG. 22, the back-gate or body bias of each transistor device can be used to configure the threshold voltage dynamically to account for the effects associated with the cooling of the chip in a cryogenic environment. The transistor devices and the related control circuits are designed such that using the back-gate bias control, the threshold voltage of the transistor devices can be tuned despite the huge change in the operating temperature of the transistor devices. In some examples, different back gate bias is provided for transistors with different aspect ratios. Although FIG. 22 shows FDSOI analog device 2200 including certain number and type of wells, FDSOI analog device 2200 may include additional or fewer wells of other types. In addition, the transistor devices may be planar or non-planar (e.g., FinFET devices).

In one example cryogenic-CMOS control chip, the FDSOI digital device 2100 may be used as part of the circuit blocks that require only a difference between a low value and a high value of voltages and are not concerned with the intermediate values. Because FDSOI digital device 2100 occupies less area than FDSOI analog device 2200, it is advantageous to use it for most of the circuits as long as they are not too sensitive. In one example, only FDSOI analog device 2200 is fabricated such that there is independent back-gate bias control for both n-type and p-type devices and independent back-gate bias control based on an aspect ratio of these devices. As mentioned earlier, the cryogenic-CMOS control chip may be partitioned into domains, such that each domain includes multiple transistor devices, but shares a common back-gate bias. In one example, there may be eight domains based on the combinations of the n-type versus p-type devices and the different aspect ratios associated with each type of the devices.

Figure 23:
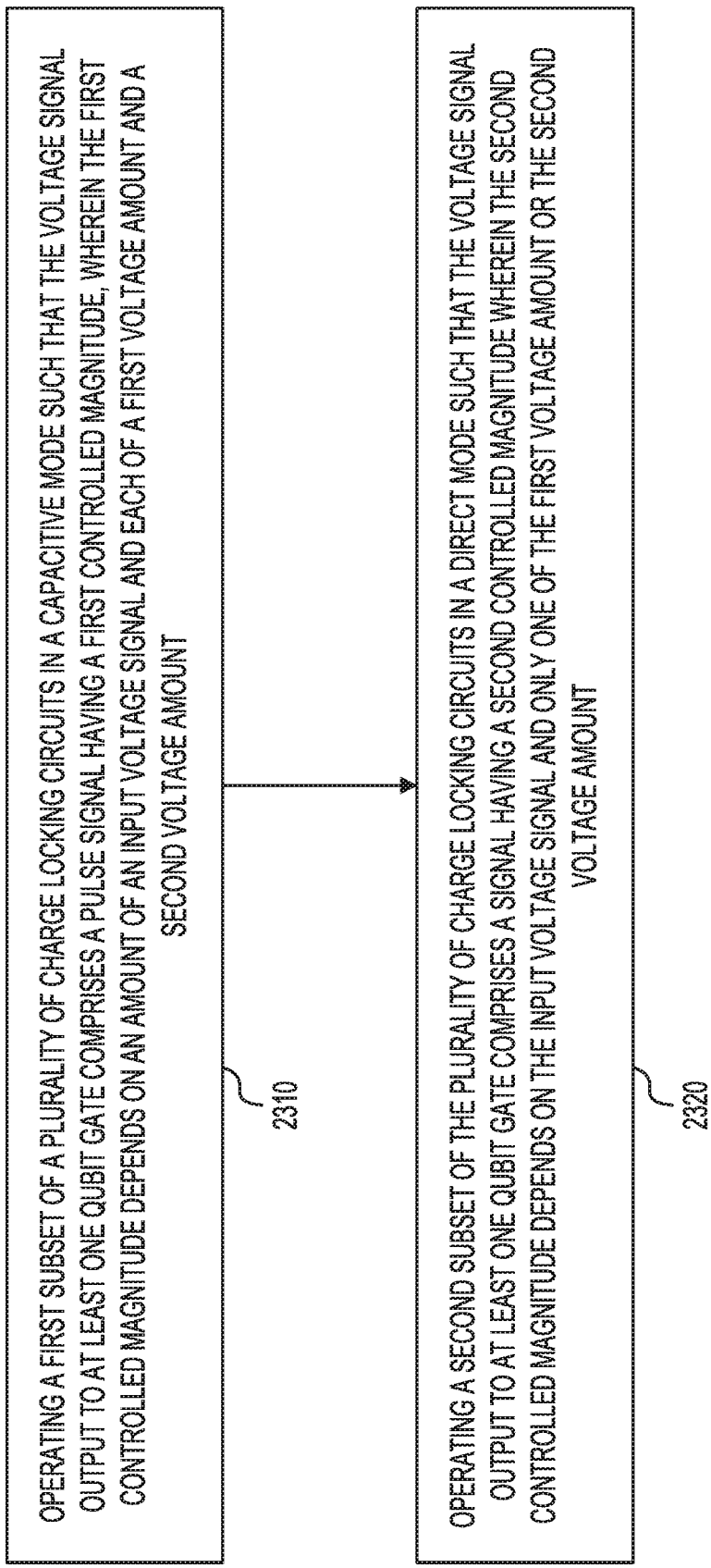
FIG. 23 shows a flowchart corresponding to a method associated with the systems described in the present disclosure.

FIG. 23 shows a flowchart 2300 corresponding to a method associated with the systems described in the present disclosure. In one example, the system for controlling qubit gates may include a quantum device including a plurality of qubit gates, where the quantum device is configured to operate at a cryogenic temperature. As an example, the quantum device may correspond to qubits 160 of FIG. 1. The system may further include a control circuit configured to operate at the cryogenic temperature, and where the control circuit comprises a plurality of charge locking circuits. As an example, the control circuit may correspond to the circuits included in the cryogenic-CMOS control chip described earlier. Each of the plurality of charge locking circuits may be coupled to at least one qubit gate of the plurality of qubit gates via an interconnect such that each of the plurality of charge locking circuits is configured to provide a voltage signal to the at least one qubit gate, where each of the plurality of charge locking circuits comprises a first terminal for receiving an input voltage signal and a second terminal for selectively receiving a first voltage amount or a second voltage amount, where the first voltage amount is greater than the second voltage amount. As an example, the charge locking circuits may be included as part of CLFG cells 360. Each charge locking circuit may correspond to any of CLFG cell 500, CLFG cell 1300, or CLFG cell 1400 described earlier.

Step 2310 may include operating a first subset of the plurality of charge locking circuits in a capacitive mode such that the voltage signal output to at least one qubit gate comprises a pulse signal having a first controlled magnitude, where the first controlled magnitude depends on an amount of the input voltage signal and each of the first voltage amount and the second voltage amount. In one example, this step may relate to the operation of CLFG cell 1300. As described earlier, CLFG cell 1300 may include a switch 1312, which may be operated in response to the CL_EN<N> signal. This signal may be provided under the control of an appropriate finite state machine or another type of logic as described with respect to FIG. 10. When switch 1312 is closed the voltage (referred to as $V_{HOLD}$ in FIG. 5) received via the input terminal (IN) on signal line VICL may be coupled to one plate of the capacitor labeled $C_{PULSE, N}$, which represents the on-chip capacitance. CLFG cell 1300 may further include a switch 1314 and a switch 1316. CLFG cell 1300 may further include an inverter 1318. CLFG cell 1300 may be configured such that only one of these switches is closed at a time. In this example, the signal that is labeled CL_EN<N> may control switch 1314 and an inverted version of this signal (e.g., inverted by inverter 1318) may control switch 1316. This way at a time either voltage $V_{HIGH}$ or voltage $V_{LOW}$ may be coupled via one of the two switches to the second plate of capacitor labeled $C_{PULSE, N}$, which represents the on-chip capacitance.

Step 2320 may include operating a second subset of the plurality of charge locking circuits in a direct mode such that the voltage signal output to at least one qubit gate comprises a signal having a second controlled magnitude where the second controlled magnitude depends on the input voltage signal and only one of the first voltage amount or the second voltage amount. In one example, this step may relate to the operation of CLFG cell 1400. As explained earlier, CLFG cell 1400 may operate in the direct mode when the CL_MODE signal is de-asserted. Thus, when the CL_MODE signal is de-asserted, switch 1434 is closed and depending on a status of the CL_EN<N> signal, either switch 1436 or switch 1438 is closed. As a result, at a time either voltage $V_{HIGH}$ or voltage $V_{LOW}$ may be coupled via one of the two switches to the same terminal to which the $V_{IN}$ voltage via the input terminal (IN) is coupled.

In conclusion, in one aspect, the present disclosure relates to a system for controlling qubit gates. The system may include a first packaged device comprising a quantum device including a plurality of qubit gates, where the quantum device is configured to operate at a cryogenic temperature. The system may further include a second packaged device comprising a control circuit configured to operate at the cryogenic temperature, where the first packaged device is coupled to the second packaged device, and where the control circuit comprises a plurality of charge locking circuits, where each of the plurality of charge locking circuits is coupled to at least one qubit gate of the plurality of qubit gates via an interconnect such that each of the plurality of charge locking circuits is configured to provide a voltage signal to at least one qubit gate.

Each of the plurality of charge locking circuits may comprise an input terminal for receiving an input voltage signal and an output terminal for selectively providing the voltage signal to at least one qubit gate. Each of the plurality of charge locking circuits may further comprise a capacitor having a first terminal for receiving the input voltage signal and a second terminal for selectively receiving a first voltage amount or a second voltage amount, where the first voltage amount is greater than the second voltage amount.

Each of the plurality of charge locking circuits may be configured to generate the voltage signal as a pulse signal having a controlled magnitude, where the controlled magnitude depends at least on the first voltage amount and the second voltage amount. At least a subset of the plurality of charge locking circuits may be configured to operate in one of a direct mode or a capacitive mode. Each of the at least the subset of the plurality of charge locking circuits may comprise a capacitor having a first terminal for receiving an input voltage signal and a second terminal for selectively receiving a first voltage amount or a second voltage amount, where the first voltage amount is greater than the second voltage amount. The capacitor may not be charged during the direct mode. The capacitor may be charged during the capacitive mode.

Each of the plurality of charge locking circuits may comprise a plurality of transistor devices and each of at least a subset of the plurality of transistors may include a back-gate bias terminal. The back-gate bias terminal may be configured to receive a voltage to vary a threshold voltage associated with a respective transistor. The control circuit may further comprise control logic configured to control at least one control signal associated with each of the plurality of charge locking circuits.

In another aspect, the present disclosure relates to a method a system for controlling qubit gates comprising a quantum device including a plurality of qubit gates, where the quantum device is configured to operate at a cryogenic temperature and a control circuit configured to operate at the cryogenic temperature, and where the control circuit comprises a plurality of charge locking circuits, where each of the plurality of charge locking circuits is coupled to at least one qubit gate of the plurality of qubit gates via an interconnect such that each of the plurality of charge locking circuits is configured to provide a voltage signal to the at least one qubit gate, and where each of the plurality of charge locking circuits comprises a first terminal for receiving an input voltage signal and a second terminal for selectively receiving a first voltage amount or a second voltage amount, and where the first voltage amount is greater than the second voltage amount. The method may include operating a first subset of the plurality of charge locking circuits in a capacitive mode such that the voltage signal output to at least one qubit gate comprises a pulse signal having a first controlled magnitude, where the first controlled magnitude depends on an amount of the input voltage signal and each of the first voltage amount and the second voltage amount. The method may further include operating a second subset of the plurality of charge locking circuits in a direct mode such that the voltage signal output to at least one qubit gate comprises a signal having a second controlled magnitude where the second controlled magnitude depends on the input voltage signal and only one of the first voltage amount or the second voltage amount.

The control circuit may further comprise control logic configured to control at least one control signal associated with each of the plurality of charge locking circuits. Each of the plurality of charge locking circuits may comprise a plurality of transistor devices and each of at least a subset of the plurality of transistors includes a back-gate bias terminal. The back-gate bias terminal may be configured to receive a voltage to vary a threshold voltage associated with a respective transistor.

In yet another aspect, the present disclosure relates to a system for controlling qubit gates. The system may include a quantum device including a plurality of qubit gates, where the quantum device is configured to operate at a cryogenic temperature. The system may further include a control circuit configured to operate at the cryogenic temperature, where the control circuit comprises a plurality of charge locking circuits, where each of the plurality of charge locking circuits is coupled to at least one qubit gate of the plurality of qubit gates via an interconnect such that each of the plurality of charge locking circuits is configured to provide a voltage signal to the at least one qubit gate, and where each of the plurality of charge locking circuits comprises an input terminal for receiving an input voltage signal and an output terminal for selectively providing the voltage signal to the at least one qubit gate, and where the control circuit further comprises control logic configured to provide at least one control signal associated with each of the plurality of charge locking circuits.

Each of the plurality of charge locking circuits may further comprise a capacitor having a first terminal for receiving the input voltage signal and a second terminal for selectively receiving a first voltage amount or a second voltage amount, where the first voltage amount is greater than the second voltage amount, and where each of the plurality of charge locking circuits is configured to generate the voltage signal as a pulse signal having a controlled magnitude, where the controlled magnitude depends at least on the first voltage amount and the second voltage amount.

At least a subset of the plurality of charge locking circuits may be configured to operate in one of a direct mode or a capacitive mode, and where each of the at least the subset of the plurality of charge locking circuits comprises a capacitor having a first terminal for receiving an input voltage signal and a second terminal for selectively receiving a first voltage amount or a second voltage amount, where the first voltage amount is greater than the second voltage amount. The capacitor may not be charged during the direct mode. The capacitor may be charged during the capacitive mode.

It is to be understood that the methods, modules, and components depicted herein are merely exemplary. For example, and without limitation, illustrative types of devices may include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc.

In addition, in an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A system for controlling qubit gates comprising:
a first packaged device comprising a quantum device including a plurality of qubit gates, wherein the quantum device is configured to operate at a cryogenic temperature; and
a second packaged device comprising a control circuit configured to operate at the cryogenic temperature, wherein the first packaged device is coupled to the second packaged device, and wherein the control circuit comprises a plurality of charge locking circuits, wherein each of the plurality of charge locking circuits is coupled to at least one qubit gate of the plurality of qubit gates via an interconnect such that each of the plurality of charge locking circuits is configured to provide a voltage signal to at least one qubit gate, wherein each of the plurality of charge locking circuits comprises an input terminal for receiving an input voltage signal and an output terminal for selectively providing the voltage signal to at least one qubit gate, and wherein each of the plurality of charge locking circuits further comprises a capacitor having a first terminal for receiving the input voltage signal and a second terminal for selectively receiving a first voltage amount or a second voltage amount, wherein the first voltage amount is greater than the second voltage amount.

2. The system of claim 1, wherein each of the plurality of charge locking circuits is configured to generate the voltage signal as a pulse signal having a controlled magnitude, wherein the controlled magnitude depends at least on the first voltage amount and the second voltage amount.

3. The system of claim 1, wherein at least a subset of the plurality of charge locking circuits is configured to operate in one of a direct mode or a capacitive mode.

4. The system of claim 3, wherein each of the at least the subset of the plurality of charge locking circuits comprises a capacitor having a first terminal for receiving an input voltage signal and a second terminal for selectively receiving a first voltage amount or a second voltage amount, wherein the first voltage amount is greater than the second voltage amount.

5. The system of claim 3, wherein the capacitor is not charged during the direct mode.

6. The system of claim 3, wherein the capacitor is charged during the capacitive mode.

7. The system of claim 1, wherein each of the plurality of charge locking circuits comprises a plurality of transistor devices, and wherein each of at least a subset of the plurality of transistors includes a back-gate bias terminal.

8. The system of claim 7, wherein the back-gate bias terminal is configured to receive a voltage to vary a threshold voltage associated with a respective transistor.

9. The system of claim 1, wherein the control circuit further comprises control logic configured to control at least one control signal associated with each of the plurality of charge locking circuits.

10. A method in a system for controlling qubit gates comprising a quantum device including a plurality of qubit gates, wherein the quantum device is configured to operate at a cryogenic temperature and a control circuit is configured to operate at the cryogenic temperature, and wherein the control circuit comprises a plurality of charge locking circuits, wherein each of the plurality of charge locking circuits is coupled to at least one qubit gate of the plurality of qubit gates via an interconnect such that each of the plurality of charge locking circuits is configured to provide a voltage signal to the at least one qubit gate, and wherein each of the plurality of charge locking circuits comprises a first terminal for receiving an input voltage signal and a second terminal for selectively receiving a first voltage amount or a second voltage amount, and wherein the first voltage amount is greater than the second voltage amount, the method comprising:
operating a first subset of the plurality of charge locking circuits in a capacitive mode such that the voltage signal output to at least one qubit gate comprises a pulse signal having a first controlled magnitude, wherein the first controlled magnitude depends on an amount of the input voltage signal and each of the first voltage amount and the second voltage amount; and
operating a second subset of the plurality of charge locking circuits in a direct mode such that the voltage signal output to at least one qubit gate comprises a signal having a second controlled magnitude wherein the second controlled magnitude depends on the input voltage signal and only one of the first voltage amount or the second voltage amount.

11. The method of claim 10, wherein the control circuit further comprises control logic configured to control at least one control signal associated with each of the plurality of charge locking circuits.

12. The method of claim 10, wherein each of the plurality of charge locking circuits comprises a plurality of transistor devices, and wherein each of at least a subset of the plurality of transistors includes a back-gate bias terminal.

13. The method of claim 12, wherein the back-gate bias terminal is configured to receive a voltage to vary a threshold voltage associated with a respective transistor.

14. A system for controlling qubit gates comprising:
a quantum device including a plurality of qubit gates, wherein the quantum device is configured to operate at a cryogenic temperature; and
a control circuit configured to operate at the cryogenic temperature, wherein the control circuit comprises a plurality of charge locking circuits, wherein each of the plurality of charge locking circuits is coupled to at least one qubit gate of the plurality of qubit gates via an interconnect such that each of the plurality of charge locking circuits is configured to provide a voltage signal to the at least one qubit gate, and wherein each of the plurality of charge locking circuits comprises an input terminal for receiving an input voltage signal and an output terminal for selectively providing the voltage signal to the at least one qubit gate, and wherein the control circuit further comprises control logic configured to provide at least one control signal associated with each of the plurality of charge locking circuits, wherein each of the plurality of charge locking circuits further comprises a capacitor having a first terminal for receiving the input voltage signal and a second terminal for selectively receiving a first voltage amount or a second voltage amount, wherein the first voltage amount is greater than the second voltage amount.

15. The system of claim 14, wherein each of the plurality of charge locking circuits is configured to generate the voltage signal as a pulse signal having a controlled magnitude, wherein the controlled magnitude depends at least on the first voltage amount and the second voltage amount.

16. The system of claim 14, wherein at least a subset of the plurality of charge locking circuits is configured to operate in one of a direct mode or a capacitive mode, and wherein each of the at least the subset of the plurality of charge locking circuits comprises a capacitor having a first terminal for receiving an input voltage signal and a second terminal for selectively receiving a first voltage amount or a second voltage amount, wherein the first voltage amount is greater than the second voltage amount.

17. The system of claim 16, wherein the capacitor is not charged during the direct mode.

18. The system of claim 16, wherein the capacitor is charged during the capacitive mode.

19. The system of claim 1, wherein each of the plurality of charge locking circuits further comprises a switch for selectively coupling the input voltage signal received via the input terminal to the first terminal of the capacitor.

20. The system of claim 14, wherein each of the plurality of charge locking circuits further comprises a switch for selectively coupling the input voltage signal received via the input terminal to the first terminal of the capacitor.

* * * * *